United States Patent [19]
Hashimoto

[11] Patent Number: 5,668,752
[45] Date of Patent: Sep. 16, 1997

[54] MULTI-STAGE ROM WHEREIN A CELL CURRENT OF A SELECTED MEMORY CELL IS COMPARED WITH A PLURALITY OF CONSTANT CURRENTS WHEN DRIVEN TO READ VOLTAGES

[75] Inventor: Kiyokazu Hashimoto, Tokyo, Japan

[73] Assignee: NEC Corporation, Tokyo, Japan

[21] Appl. No.: 625,994

[22] Filed: Apr. 1, 1996

[30] Foreign Application Priority Data

Mar. 31, 1995 [JP] Japan ..................... 7-075766

[51] Int. Cl.$^6$ ................................ G11C 17/10
[52] U.S. Cl. ............... 365/104; 365/189.07; 365/230.06
[58] Field of Search ..................... 365/104, 103, 365/168, 178, 189.07, 230.06

[56] References Cited

U.S. PATENT DOCUMENTS 5,323,342  6/1994  Wada et al. ............................ 365/104
5,341,337  8/1994  Hotta ..................................... 365/204

FOREIGN PATENT DOCUMENTS 53-81024  7/1978  Japan .
5-47188   2/1993  Japan .

Primary Examiner—David C. Nelms
Assistant Examiner—Andrew Q. Tran
Attorney, Agent, or Firm—Foley & Lardner

[57] ABSTRACT

For a nonvolatile multi-stage semiconductor memory device, a data reading sequence is given first, second, and third phases. During the first phase, a word line is driven to 2.25 V with a differential amplifier and a bias circuit activated to sense on or off of a selected memory cell. During the second phase, the word line is driven to 3.0 V with a differential amplifier and a bias circuit activated to sense on or off of the selected memory cell. This enables correct read out with a low operating voltage, such as 3.0 V, of data stored in semiconductor memory cells with a selected one of four threshold levels given to each datum. During the third phase, it is possible to use the differential amplifier and the bias circuit which are used during the first phase. Use of one differential amplifier alone is possible with two bias circuits used. Use of only first and second phases is also possible.

13 Claims, 14 Drawing Sheets

| | E1 | E2 | E3 | D(o1) | D(o2) |
|---|---|---|---|---|---|
| VT(0) (0.5V) | 0 | 0 | 0 | 0 | 0 |
| VT(1) (2.0V) | 0 | 1 | 0 | 0 | 1 |
| VT(2) (2.5V) | 1 | 1 | 0 | 1 | 0 |
| VT(3) (4.0V) | 1 | 1 | 1 | 1 | 1 |

MULTI-STAGE ROM WHEREIN A CELL CURRENT OF A SELECTED MEMORY CELL IS COMPARED WITH A PLURALITY OF CONSTANT CURRENTS WHEN DRIVEN TO READ VOLTAGES

BACKGROUND OF THE INVENTION

This invention relates to a multi-stage semiconductor memory comprising a plurality of semiconductor memory cells, each loaded with a datum of two or more bits, and more particularly to a method of reading such data from the memory cells and to a multi-stage semiconductor memory device of the type described.

In order to give a large memory capacity to a nonvolatile semiconductor memory device (herein referred to as an ROM), known is a scheme of storing a datum of a plurality of bits in a selected memory cell of the semiconductor memory cells. Such a multi-stage ROM is disclosed, for example, in Japanese Patent Prepublication (A) No. 81,024 of 1978. According to this patent prepublication, ions are selectively injected by using four different masks into a semiconductor substrate to different impurity concentrations in order to enable each semiconductor memory cell to store information of sixteen different kinds, namely, four-bit information. This provides a four-stage ROM with a quarter of semiconductor memory cells of a usual ROM of a common memory capacity.

It is, however, necessary on reading the data not only to sense on or off of the selected memory cell by supply of a read voltage (for example, 5 V) to a selected word line and to a selected digit line of the multi-stage ROM but also to sense a selected threshold level of a plurality of predetermined threshold levels that is given to the selected memory cell in correspondence to a selected one of the different kinds of information. Two typical manners are known for sensing the selected threshold level. A first manner of the two manners is revealed in Japanese Patent Prepublication (A) No. 47,188 of 1993. A second manner is similar partly to the method according to this invention.

In the manner which will later be described in greater detail, the first manner uses successive drive of the selected word line with different read voltages to sense the selected digit line to decide at which of the different read voltages the selected threshold level is exceeded. When the different kinds are four in number, the different read voltages are three in number and may be equal to 2.0 V, 3.5 V, and 5.0 V. In the four-stage ROM, a sensing unit merely senses the selected digit line as regards on or off of the selected memory cell at each of up to three read voltages and is therefore relatively simple in structure. The sensing unit must, however, sense the on or off of the selected memory cell as much as three times in an extreme case. As a consequence, a read voltage supply unit of such a multi-stage ROM must have a complicated structure. Moreover, each word line has a large load capacitance and requires an appreciable length of time before driven stably to one of the different read voltages. As a result, it takes an objectionably long time to read each datum.

According to the second manner, the selected word line is driven to a predetermined read voltage of 3.0 V for example. The sensing unit senses the selected digit line as regards a cell current which flows in the multi-stage ROM through the selected memory cell to which the selected threshold level is given in correspondence to a selected one of the different kinds of information. On reading a datum stored in the selected memory cell, its cell current is compared with a plurality of predetermined constant currents. In order to definitely decide the datum, a greater cell current must be used, such as about twice as strong as a smaller cell current. When the different kinds of information are four in number, the cell current must have three different values of a ratio of 1:4:16. Use of simple circuitry is sufficient for the read voltage supply unit. The cell currents, however, have current values strongly dependent on the selected threshold level. Particularly when an operating voltage is low on putting the multi-stage ROM in operation, the predetermined threshold levels have only a small difference between two consecutive ones of the threshold levels. This makes it unavoidable to use a small voltage difference between two adjacent ones of the constant currents. As a result, the sensing unit undesiredly renders it impossible to read the data.

SUMMARY OF THE INVENTION

It is consequently an object of the present invention to provide a method of reading data from a multi-stage semiconductor memory device comprising a plurality of transistor memory cells, each given a selected threshold level selected from a plurality of predetermined threshold levels, which method is correctly and exactly operable even when the multi-stage semiconductor memory device is put in operation with a low operating voltage, such as about 3.0 V.

It is another object of this invention to provide a method which is of the type described and makes it possible to quickly read the data.

It is still another object of this invention to provide a method which is of the type described and in which it is unnecessary to use a read voltage supply unit of a complicated structure.

It is yet another object of this invention to provide a method which is of the type described and in which the predetermined threshold levels need not be very critical.

It is a different object of this invention to provide a multi-stage semiconductor memory device by which it is readily possible to carry out the method of the type described.

Other objects of this invention will become clear as the description proceeds.

In accordance with an aspect of this invention, there is provided a method of reading data from a multi-stage semiconductor memory device comprising a plurality of transistor memory cells, each given a selected threshold level selected from a zeroth threshold level, a first threshold level higher than the zeroth threshold level, a second threshold level higher than the first threshold level, and a third threshold level higher than the second threshold level, which method comprises the steps of: (A) selecting a selected memory cell from the transistor memory cells; (B) judging on or off of the selected memory cell when the selected memory cell is supplied with a first voltage between the first and the second threshold levels; and (C) judging from a cell current flowing through the selected memory cell during supply to the selected memory cell with a second voltage between the second and the third threshold level whether or not the selected threshold level is the zeroth threshold level.

In accordance with a different aspect of this invention, there is provided a multi-stage semiconductor memory device comprising: (A) a plurality of transistor memory cells, each given a selected threshold level selected from a zeroth threshold level, a first threshold level higher than the zeroth threshold level, a second threshold level higher than the first threshold level, and a third threshold level higher than the second threshold level; (B) selecting means responsive to address signals for selecting a selected memory cell from the semiconductor memory cells; (C) supply means responsive to a control signal variable between first and second logic levels for supplying the selected memory cell with a first voltage between the zeroth and the first threshold levels and a second voltage between the second and the third threshold levels while the control signal has the first and the second logic levels, respectively; (D) first judging means for judging on or off of the selected memory cell while the control signal has the first logic level; and (E) second judging means for judging, by comparison between a predetermined constant current and a cell current flowing through the selected memory cell while the control signal has the second logic level, whether or not the selected threshold level is the zeroth threshold level.

In accordance with another different aspect of this invention, there is provided a multi-stage semiconductor memory device comprising (a) first through N-th word lines and (b) first through M-th digit lines crossing the first through the N-th word lines at cross points, where N and M represent first and second predetermined integers, (c) a plurality of semiconductor memory cells at the cross points, (d) selecting means responsive to address signals for selecting a selected word line from the first through the N-th word lines and a selected digit line from the first through the M-th digit lines, (e) driving means for driving the selected word line to one of first and second voltages, and (f) sensing means for sensing a cell current flowing through the selected digit line, wherein the sensing means compares the cell current with first and second constant currents while the selected word line is driven to the first and the second voltages, respectively.

DESCRIPTION OF THE PREFERRED EMBODIMENTS

Figure 1:
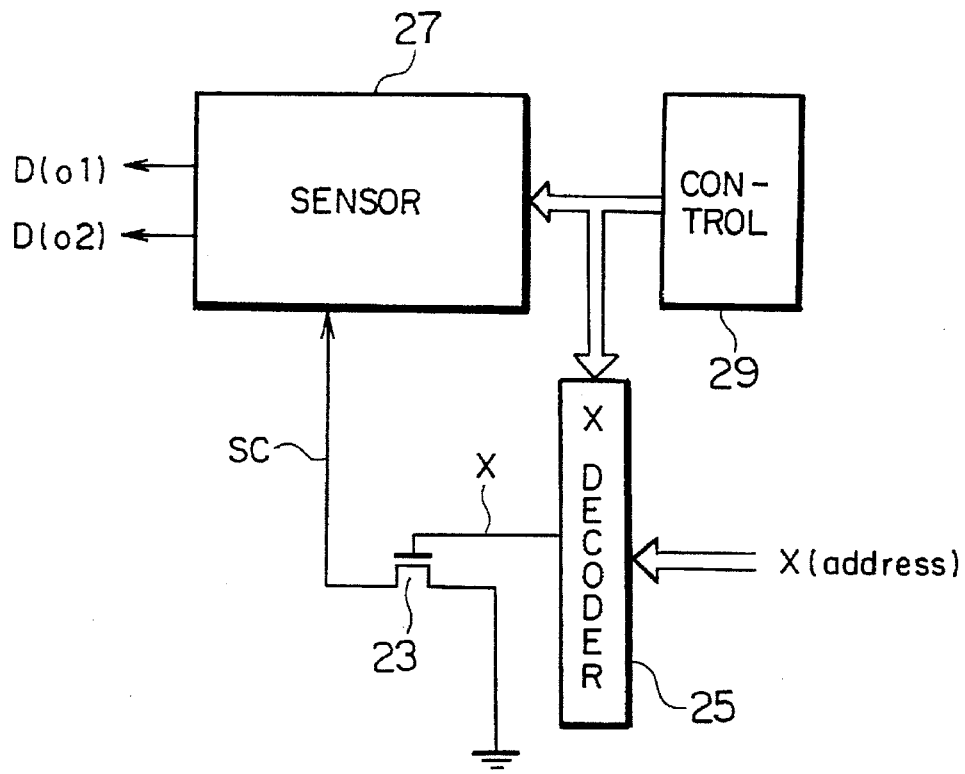
FIG. 1 is a block diagram of a conventional multi-stage ROM.

Referring to FIG. 1, a conventional multi-stage nonvolatile semiconductor memory device hereafter called a conventional ROM) will first be described in order to facilitate an understanding of the present invention. This conventional ROM will be described based on the specification of the Japanese patent prepublication referenced heretobefore.

Such an ROM comprises a memory cell unit 21 (later illustrated). The memory cell unit 21 comprises a plurality of transistor memory cells capable, for read out as data, of storing information of a plurality of kinds. The transistor memory cells are arranged in an array of typically rows and columns. It will be presumed throughout most of the description that the transistor memory cells are for information of four kinds, namely, of two bits.

Each transistor memory cell may comprise a plurality of memory transistors. In this figure, only one memory transistor 23 is exemplified and is connected to a word line X and to a digit line SC with a source electrode grounded.

Responsive to an X address signal X(address), a word or X decoder 25 selects the word line X as a selected word line. A sensor unit 27 is connected to the digit line SC and produces two-bit device output signal D(o1) and D(o2) in the manner which will presently be described. A control unit 29 is for controlling the word decoder 25 and the sensor unit 27.

Figure 2:
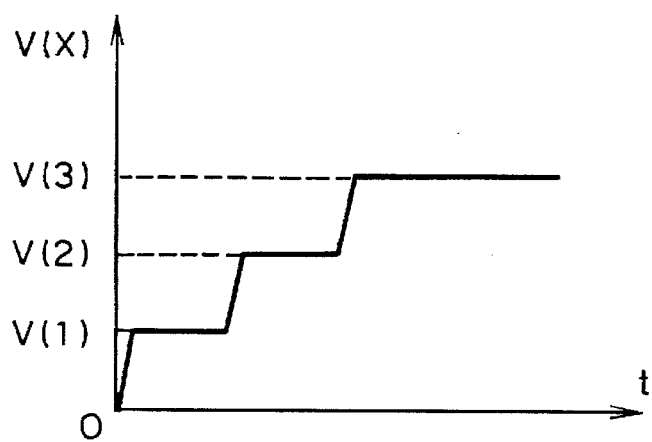
FIG. 2 is a graph illustrative of a drive voltage used in the ROM illustrated in FIG. 1.

Turning to FIG. 2 with FIG. 1 continuously referred to, the word decoder 25 drives the word line X to a read voltage V(X). In the example being illustrated, the read voltage is varied with time t successively to a first voltage V(1), a second voltage V(2), and a third voltage V(3). The memory transistor 23 is preliminarily given a selected threshold level selected from a zeroth threshold level VT(0), a first threshold level VT(1) higher than the zeroth threshold level, a second threshold level VT(2) higher than the first threshold level, and a third threshold level VT(3) higher than the second threshold level in response to a control signal supplied from the control unit 29. These threshold levels are predetermined and are in correspondence to the four kinds of information.

The first voltage is between the zeroth and the first threshold levels. The second voltage is between the first and the second threshold levels. The third voltage is between the second and the third threshold levels. When the zeroth through the third threshold levels are 0.5, 3.0, 4.5, and 6.0 V, the first through the third voltages are, for example, 2.0, 3.5, and 5.0 V.

If the selected threshold level is the zeroth threshold level, the memory transistor 23 is turned on when the word line is driven at least to the first voltage. If the selected threshold level is the first threshold level, the memory transistor 23 is switched on when the read voltage is raised at least to the second voltage. If given the second threshold level, the memory transistor 23 turns on when the read voltage is raised ultimately to the third voltage. If preliminarily set at the third threshold level, the memory transistor 23 remains off while the read voltage is changed to the first through the third voltages.

Responsive to the control signal, the sensor unit 27 senses which of the first through the third voltage turns the memory transistor 23 on or keeps it off. Based on such results of detection of on and off, the sensor unit 27 produces the two-bit device output signal.

Figure 3:
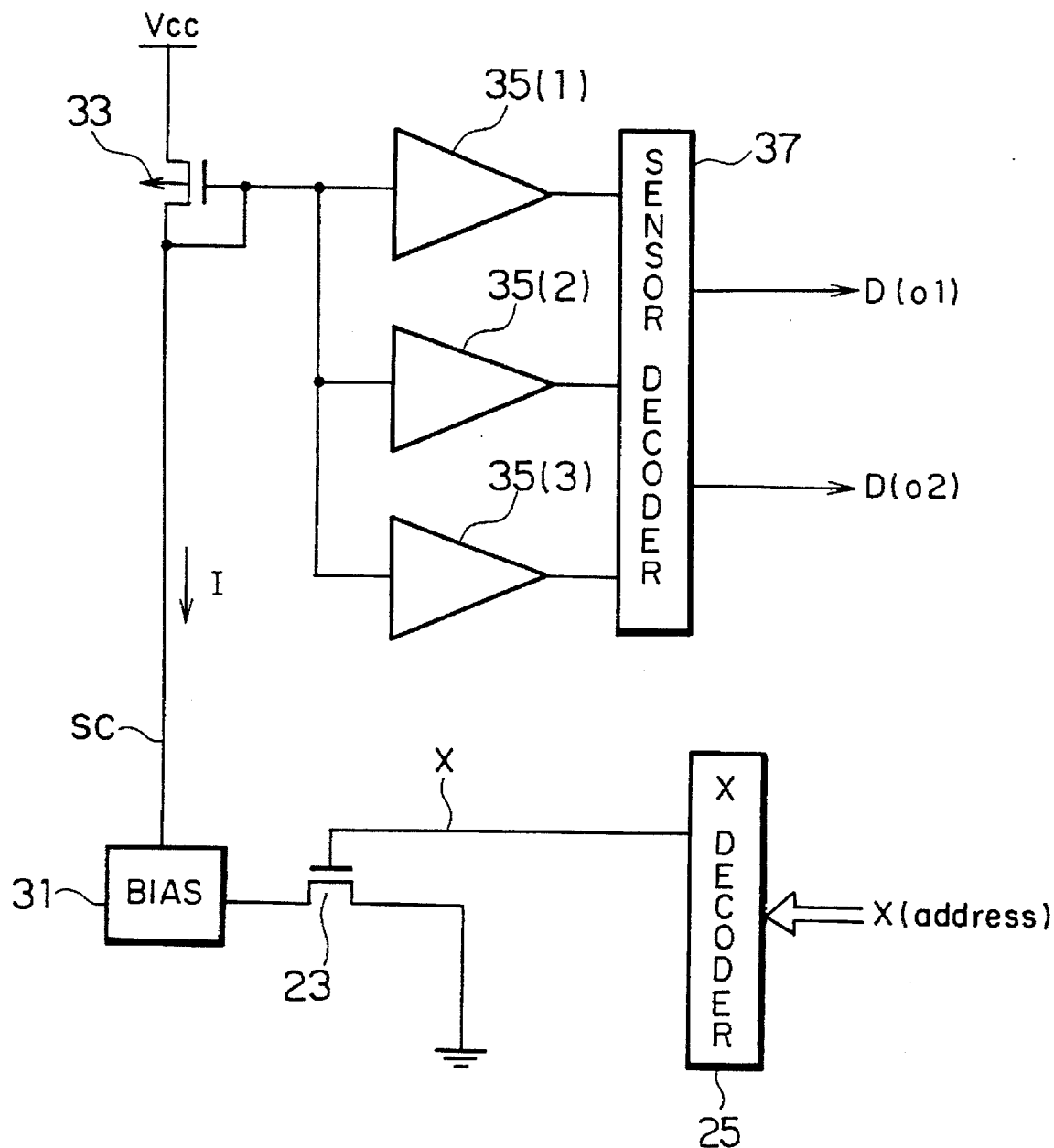
FIG. 3 is a block diagram of another conventional multi-stage ROM.

Referring to FIG. 3, another conventional ROM will be described. Throughout the drawing figures, similar parts are designated by like reference numerals. Operation may, however, differ as will explicitly be described.

The memory transistor 23 has a drain electrode connected to a bias circuit 31 which is connected in turn to the digit line SC. Through a p-channel MOS transistor 33 supplied with a power source voltage Vcc of typically 5.0 V, the digit line SC is connected to first through third sense amplifiers 35(1), 35(2), and 35(3), which are connected in turn to a sensor decoder 37 for producing the two-bit device output signals D(o1) and D(o2). Responsive to the X address signal, the word decoder 25 supplies the selected word line with the power source voltage as the read voltage. The first through the third sense amplifiers will either singly or collectively be designated by a simple reference numeral 35. This manner of designation will be used in connection with various reference numerals and symbols which are already used and will hereafter appear.

Figure 4:
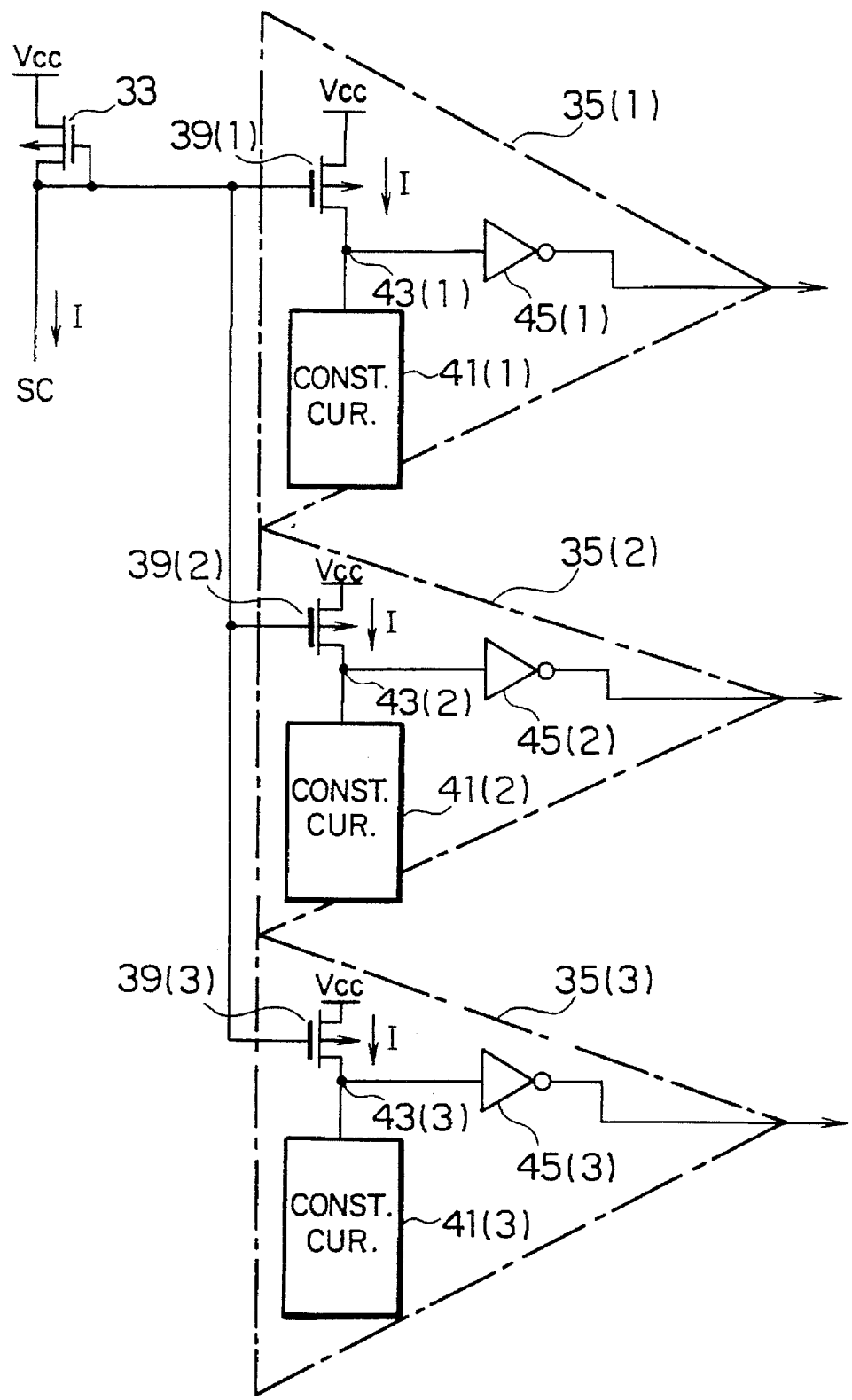
FIG. 4 shows partly in blocks a part of the ROM depicted in FIG. 3.

Turning to FIG. 4 with FIG. 3 continuously referred to, the first sense amplifier 35(1) comprises a first (pMOS) sensor transistor 39(1) connected to the p-channel MOS transistor 33 and supplied with the power source voltage at its source electrode. A first constant current source (CONST. CUR.) 41(1) is connected to the first sensor transistor 39(1) at its drain electrode and defines a first reference current I(ref1). Between the first sensor transistor 39(1) and the first constant current source 41(1), a first node point 43(1) is connected to the sensor decoder 37 through a first inverter 45(1). It will be assumed that the bias circuit 31 biases the memory transistor 23 to a drain voltage of 1.0 V. Similarly, second and third constant current sources 41(2) and 41(3) are used in the second and the third sensor amplifiers 37(2) and 37(3) to define second and third reference currents I(ref2) and I(ref3) and are connected to second and third sensor transistors 39(2) and 39(3).

Referring to FIGS. 3 and 4, predetermined threshold levels of the zeroth through the third threshold levels will be described. Even if selected (namely, even if the word line X is driven to 5.0 V), the memory transistor 23 must be kept off if given the third threshold level VT(3). Consequently, the third threshold level is set at 6.0 V. If given the zeroth threshold level VT(0), the memory transistor 23 must be kept off while not selected (namely, the word line X is given 0.0 V). The zeroth threshold level is therefore set at 0.5 V. When the memory transistor 23 of the zeroth threshold level is selected, a zeroth cell current I(0) flows therethrough.

When the memory transistor 23 of the first threshold level VT(1) is selected, a first cell unit I(1) flows therethrough. This cell current must be sufficiently smaller than the zeroth cell current. When selected, the memory transistor 23 of the second threshold level VT(2) causes a second cell current I(2) to flow therethrough. This cell current must be sufficiently smaller than the first cell current and be sufficiently distinguished from an off state. It is consequently necessary on deciding the first and the second threshold levels to clearly and distinctly differentiate the cell current among no current (namely, the off state of the memory transistor 23) and the zeroth through the second cell currents.

In view of the foregoing, predetermined reference currents of the first through the third reference currents are selected in connection with such zeroth through the second cell currents as follows. The third reference current is smaller than the second cell current. The second reference current is greater than the second cell current and is smaller than the first cell current. The first reference current is greater than the first cell current and smaller than the zeroth cell current.

Moreover, a stronger and a weaker ones of two consecutive ones of these six currents must have a ratio of at least two to one in order to clearly and distinctly differentiate between two currents. More in detail, let the third reference current have a current value of 1. In this event, the first through the third reference currents must have ratios of 1:4:16. The zeroth through the second cell currents should have also these ratios of 1:4:16. It is possible based on these cell currents to decide the zeroth through the third threshold levels.

In the manner described before, the zeroth threshold level is set at 0.5 V. When preliminarily given this threshold level, the memory transistor 23 is operable in a triode region. The zeroth cell current is therefore calculated as follows.

$$I(0)=\beta[(VG-VT(0))VD-(VD)^2/2], \quad (1)$$

where:

$$\beta=W \cdot C(Ox) \cdot \mu/L$$

and VG represents a gate voltage; VD, a drain voltage; W, a gate length; L, a gate width; C(Ox), a gate capacity per unit area; and μ, a mobility.

By the bias circuit 31, the drain voltage is set at 1 V. The zeroth cell current becomes equal to 4β. The first cell current is equal to β. The second cell current is equal to β/4.

If given the first threshold level, the memory transistor 23 is operable also in the triode region with the gate voltage minus the first threshold level understood to be greater than the drain voltage. If given the second threshold level, the memory transistor 23 is operable in a pentode region with the gate voltage minus the first threshold level understood as less than the drain voltage. The first and the second cell currents therefore become as follows.

$$I(1)=\beta[(VG-VT(1))VD-(VD)^2/2]$$

and $$I(2)=\beta(VG-VT(2))^2/2.$$

From these two equations, the first and the second threshold values are 3.5 V and 4.3 V. The zeroth through the third threshold values are in this manner VT(0)=0.5 V, VT(1)=3.5 V, VT(2)=4.3 V, and VT(3)=6.0 V.

In FIGS. 3 and 4, the conventional multi-stage ROM is operable as follows. Responsive to the X address signal, the word decoder 25 drives the selected word line X to 5.0 V. The memory transistor 23 turns on unless given the third threshold level to cause a cell current I to flow through the digit line SC. Inasmuch as the p-channel MOS transistor 33 and the first through the third sensor transistors 39 are in current mirror circuits, this current flows through the sensor transistor 39.

As a consequence, the node points 43 are given electric potentials decided by ratios of the cell current I to currents which the constant current sources 41 would cause to flow therethrough. More specifically, let the memory transistor 23 be given the zeroth threshold level. The zeroth cell current I(0) switches all the potentials to a high level at the node points 43(1) through 43(3). Let the memory transistor 23 be given the first threshold level. The first cell current I(1) turns the potentials to a low level at the node point 43(1) and to the high level at the node points 43(2) and 43(3). Let the memory transistor 23 be given the second threshold level. The second cell current I(2) turns the potential to the low level at the node points 43(1) and 43(2) and to the high level at the node point 43(3). If the memory transistor 23 is given the third threshold level so that no cell current flows, the potentials are all switched to the low level at the node points 43. Responsive to these electric potentials, the first through the third sensor amplifiers 35 produce their output signals, which the sensor decoder 37 decodes into the two-bit device output signals D(o1) and D(o2).

Reviewing FIGS. 1 through 4, the conventional multi-stage ROM's are defective in the manner pointed out hereinabove. Particularly in the multi-stage ROM illustrated with reference to FIGS. 3 and 4, correct read out of the data becomes difficult when the operating voltage (Vcc) is low. If the operating voltage is 3 V, the predetermined threshold levels must be as follows.

In the manner described before, the zeroth threshold level is equal to 0.5 V. In view of the operating voltage of 3.0 V, the third threshold level is set at 4.0 V. From Equation (1), the zeroth cell current becomes equal to $2\beta$. In view of ratios 1:4:16, the first and the second cell currents are $\beta/2$ and $\beta/8$.

When given the first and the second threshold levels, the memory transistor 23 is operable in the pentode region. It is therefore understood that the gate voltage minus the first threshold level is less than the drain voltage and that the gate voltage minus the second threshold level is less than the drain voltage. The first and the second currents are:

$$I(1)=\beta(VG-VT(1))^2/2=2.0 \text{ V}$$

$$I(2)=\beta(VG-VT(2))^4/2=2.5 \text{ V}.$$

A difference between two consecutive ones of the cell currents is very small. That between the first and the second cell currents is only 0.5 V. If the second threshold level (2.5 V) is set at 2.3 V as a result of an inevitable error of manufacture, the second cell current becomes an erroneous current:

$$I(x)=\beta(VG-2.3)^2/2=\beta/4.$$

Whereas, the second reference current should be twice the second cell current and is equal to $\beta/4$. It follows that if the second threshold level has an error of 0.2 (=2.5−2.3) V, the erroneous current can not be sensed by the second reference current.

Figure 5:
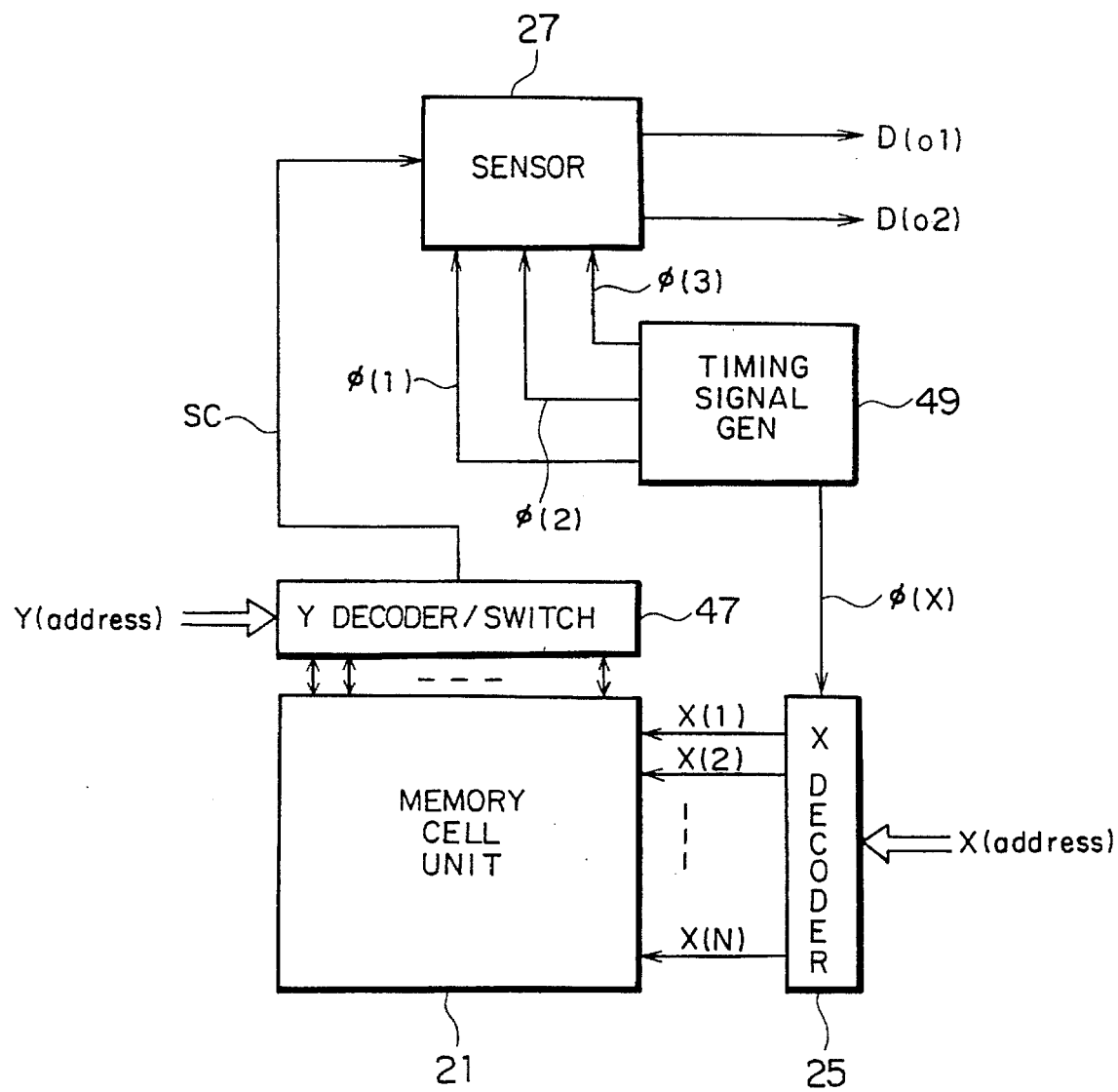
FIG. 5 is a block diagram of a multi-stage ROM according to a first embodiment of the instant invention.

Referring now to FIG. 5, the description will proceed to a multi-stage ROM according to a first embodiment of this invention. The memory cell unit 21 is illustrated and will presently be described in detail. Responsive to the X address signal, the word or X decoder 23 selectively drives first through N-th word lines X(1) to X(N) or X connected to the memory cell unit 21.

Responsive to a Y address signal Y(address), a combination of a digit or Y decoder and a Y switch, namely, a Y decoder/switch 47 selectively drives first through M-th digit lines Y(1) to Y(M) or Y connected to the memory cell unit 21 and switches these digit lines Y to a single read line which is referred to as the selected digit line SC in FIG. 1. The sensor unit 27 is connected to the read line SC and produces the two-bit device output signals D(o1) and D(o2). For use as the control unit 29 described in conjunction with FIG. 1, a timing signal generator 49 delivers an X timing signal $\phi$ (X) to the X decoder 25 and first through third (Y) timing signals $\phi$ (1), $\phi$ (2), and $\phi$ (3) to the Y decoder/switch 47 as will shortly be described.

Figure 6:
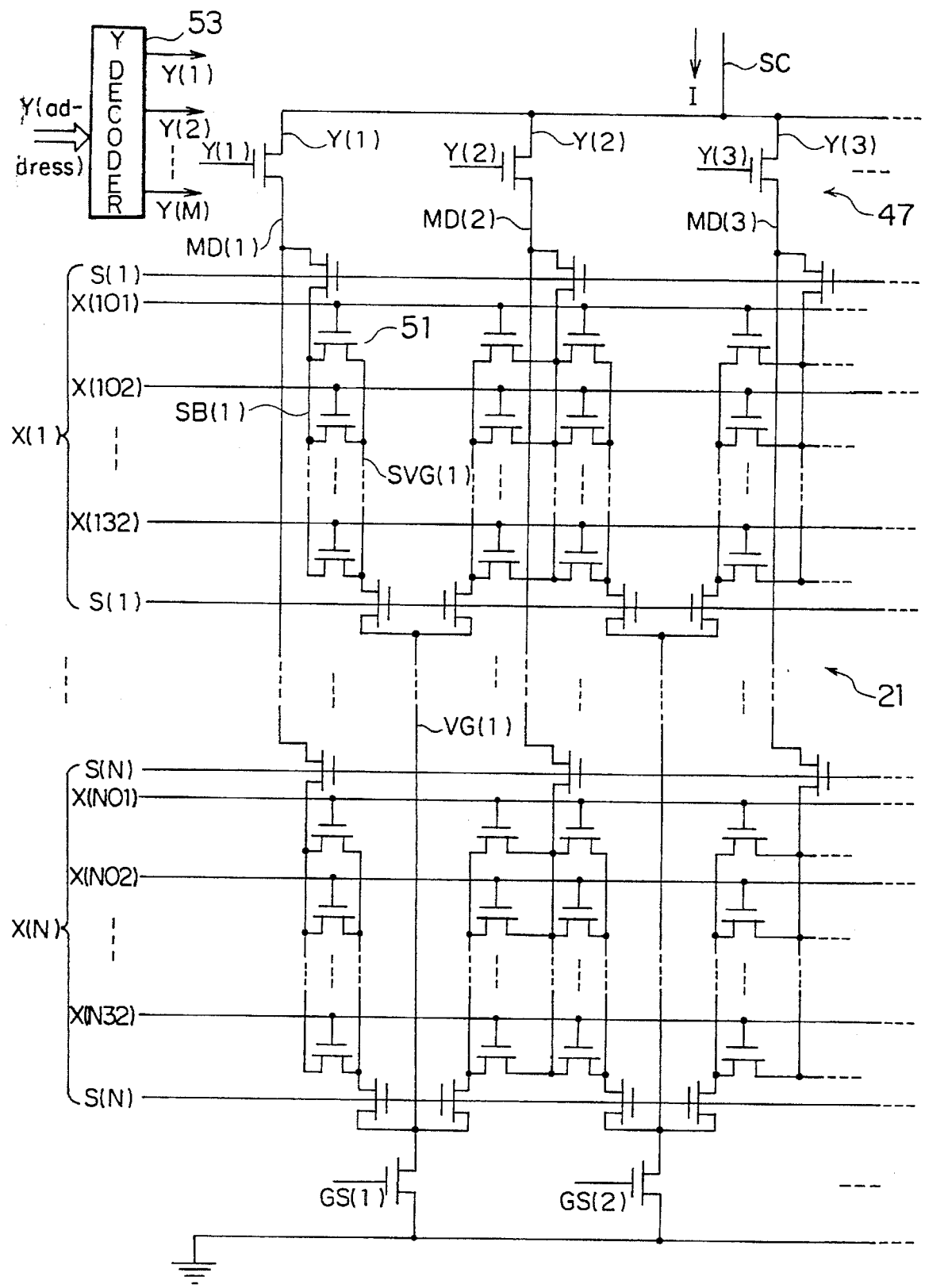
FIG. 6 shows partly in block a memory cell unit and a digit decoder/switch which are for use in the ROM illustrated in FIG. 5.

Referring to FIG. 6 with FIG. 5 continuously referred to, the memory cell unit 21 is a NOR type ROM unit of a virtually grounded configuration and comprises a plurality of memory cells 51 which will presently become clear. Each memory cell 51 is for storing information of four kinds, namely, for storing four-state data, each being a two-bit datum. Different from a usual ROM in which the memory transistor 23 (FIG. 1 or 3) has a source electrode grounded, the source electrode is connected in such a virtually grounded NOR type MOS to a virtual grounding line VG which is actually grounded only when selected by the Y address signal.

With a reference symbol n used to represent an integer variable between 1 and N, both inclusive, and with a like symbol used to represent a similar variable integer, an n-th word line X(n) comprises an n-th block line for an n-th block selection signal S(n) of first through N-th block selection signals and, in the example being illustrated, n-th primary through 32-ary word lines for n-th primary through 32-ary X signals X(n01), X(n02), . . . , and X(n32). The first through the N-th block selection signals and specific ones of the primary through the 32-ary first through N-th X Signals are selectively produced by the X decoder 25. The first through the M-th digit lines Y(1) to Y(M) are depicted, with first through M-th Y signals Y(1), Y(2), Y(3), . . . , and Y(M) (same symbols used) indicated.

Along the first through the N-th word lines X, the memory cell unit 21 is divided into first through N-th memory blocks MB(1) to MB(N). When the n-th word line is driven by the n-th block selection signal and some of the n-th primary through 32-ary X signals, an n-th memory block is connected to first through (M−1)-th virtual grounding lines VG(1) to VG(M−1) (not shown). It should be noted that such an (M−1)-th or a 2(m−1)-th element is not depicted merely for simplification of illustration.

In the Y decoder/switch 47, a Y or digit decoder 53 selectively produces the first through the M-th Y signals in response to the Y address signal and a Y switch which consists of first through M-th switch transistors switched selectively on by the first through the M-th Y signals to connect the read line SC to a selected one of the digit lines that is connected to such a switched on switch transistor. Moreover, one of first through (M−1)-th ground switch or grounding signals GS(1), GS(2), . . . , and GS(M−1) is activated to turn a corresponding one of first through (M−1)-th grounding transistors on to actually ground one of the first through the (M−1)-th virtual grounding lines VG that is connected to this turned on grounding transistor. It is possible to understand that the first through the (M−1)-th grounding signals are selectively activated by the Y decoder 53 in response to the Y address signal.

Crossing the first through the (N−1)-th block lines at first through (N−1)-th cross points, the m-th digit line ends at the m-th switch transistor which is switched on when the m-th Y signal is activated and is understood to define an N-th cross point of the m-th digit line and the N-th block line. At first primary to M-ary through N-th primary to M-ary cross points of the first through the N-th word lines and the first through the M-th digit lines, the memory cells 51 are arranged in an array of first through (2M−1)-th memory blocks in an n-th row of first through N-th rows and first through M-th columns. Each memory block of the n-th memory bank consists of thirty-two memory transistors connected to the n-th primary through the n-th 32-ary word lines. A selected one of such memory transistors is the selected memory transistor 23.

In the n-th memory bank, a 2(m−1)-th memory block is connected to a (2m−1)-th auxiliary digit line when m minus 1 is a natural number. Second up to (2m–1)-th memory blocks are connected to first (SB(1)) to (M–1)-th auxiliary digit lines. The (2M–1)-th memory block is connected to an M-th auxiliary digit line (not shown). The first through the M-th auxiliary digit lines are connected to the first through the M-th digit lines through first to M-th digit line transistors controlled concurrently by the n-th block selection signal.

Also in the n-th memory bank, the first through the (2M–1)-th memory blocks are connected to first through (2M–1)-th auxiliary virtual ground lines SVG(1) and so forth. As a pair, a 2(m–1)-th and a (2 m–1)-th auxiliary virtual ground line are connected to the (2m–1)-th virtual grounding line through a 2(m–1)-th and a (2m–1)-th transistors of first through (2M–1)-th virtual line transistors controlled simultaneously by the n-th block selection signal.

It will now be assumed that some of the memory transistors of one of the memory cells 51 are selected as selected transistors by a pertinent one S(n) of the first through the N-th block selection signals, by pertinent ones of the primary through the 32-ary X signals X(n01) to X(n32) of this one of the first through the N-th block selection signals and a relevant one of the first through the M-th Y signals Y(1) to Y(M). These selected memory transistors are connected to the read line SC and to ground. Stored in the selected memory transistors, data are delivered to the read line SC.

In correspondence to the four-state data and in the manner described in conjunction with FIGS. 1 through 4, zeroth through third threshold levels VT(0), VT(1), VT(2), and VT(3) are preliminarily given to the thirty-two memory transistors of each memory block. Assuming the power source voltage Vcc of 3.0 V, the zeroth through the third threshold levels are set at 0.5 V, 2.0 V, 2.5 V, and 4.0 V.

Figure 7:
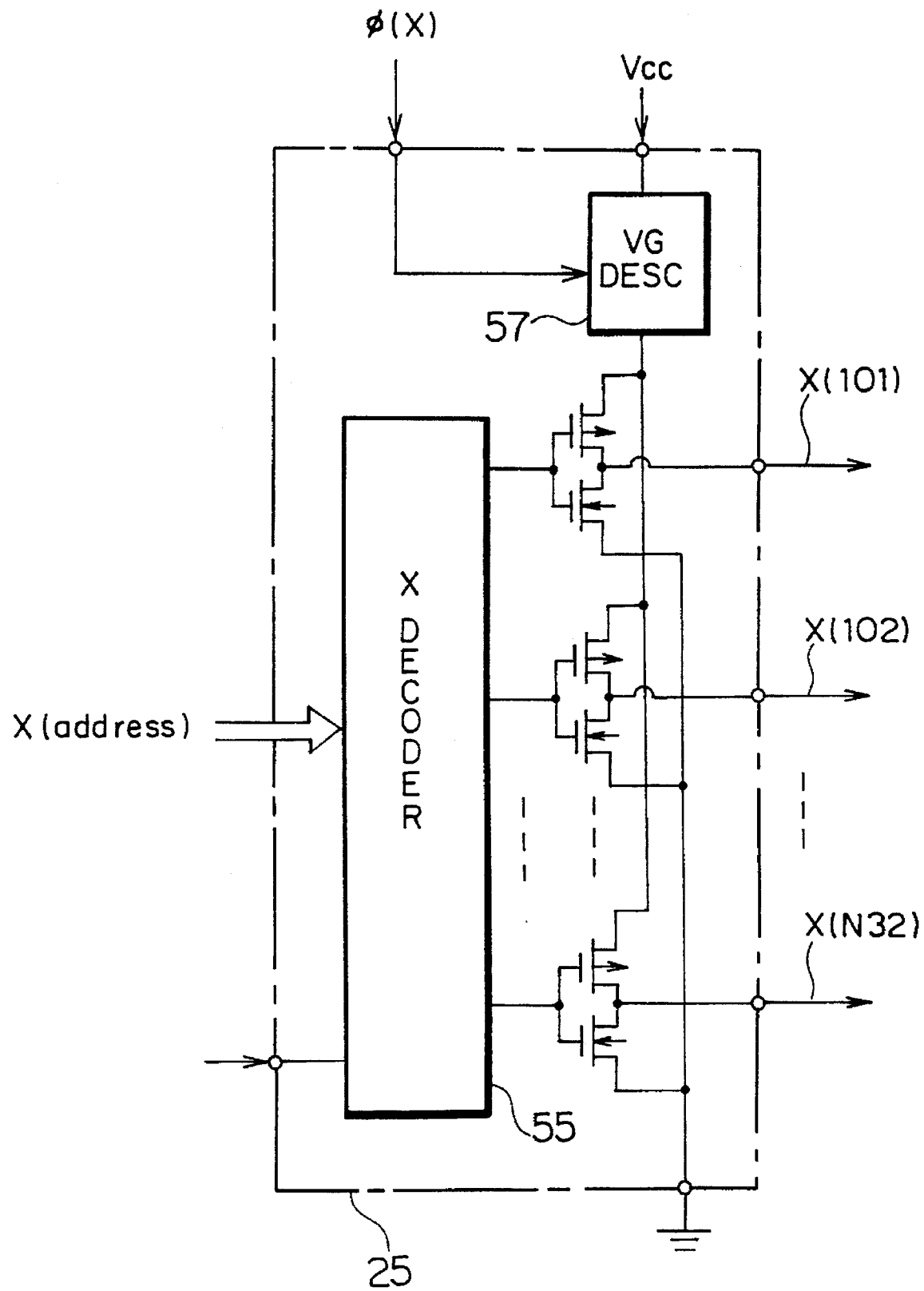
FIG. 7 shows partly in blocks a word decoder for use in the ROM depicted in FIG. 5.

Turning to FIG. 7 with FIGS. 5 and 6 continuously referred to, the X decoder 25 comprises an X element decoder 55 for decoding the X address signal into first primary to 32-ary through N-th primary to 32-ary element signals. Controlled by the X timing signal φ (X) from the timing signal generator 49 and supplied with source power of the power source voltage Vcc, a controllable voltage descender (VG DESC) 57 produces an X control signal X(c) which has the power source voltage and a reduced voltage V(down) of 2.25 V while the X timing signal has a high and a low level after start St of read of the data. Connected to the element decoder 55 and between the voltage descender 57 and ground, first through 32N-th word line drivers activate the pertinent ones of the first primary to 32-ary through the N-th primary to 32-ary X signals.

Figure 8:
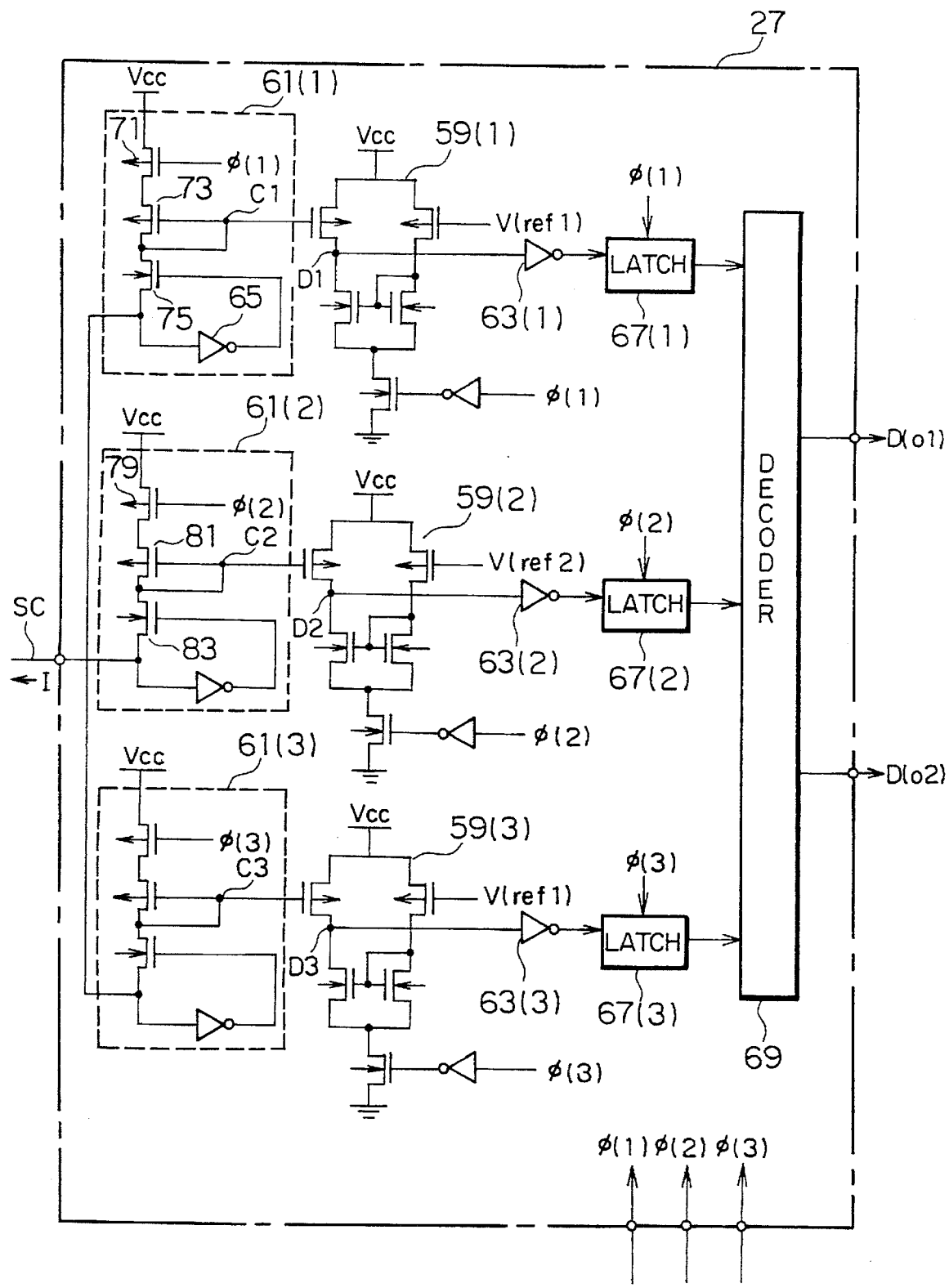
FIG. 8 shows partly in blocks a sensor unit for use in the ROM depicted in FIG. 5.

Further turning to FIG. 8 with FIGS. 5 and 6 again continuously referred to, the sensor unit 27 comprises first through third differential amplifiers 59(1), 59(2), and 59(3) or 59 between the power source and ground and controlled by the first through the third timing signals φ (1) to φ (3) of the timing signal generator 47, respectively. Each differential amplifier is activated and deactivated while a corresponding one of the first through the third timing signals has a low and a high level. The first through the third differential amplifiers 59 are supplied with a first reference voltage V(ref1) of 2.0 V, a second reference voltage V(ref2) of 1.25V, and again the first reference voltage V(ref1) and have first through third input points C1, C2, and C3 connected to first through third bias circuits 61(1), 61(2), and 61(3) or 61 and first through third output points D1, D2, and D3 connected to first through third inverters 63(1), 63(2), and 63(3) or 63.

The first through the third bias circuits 61 are connected in common to the read line SC, individually supplied with the power source, respectively activated during the low levels of the first through the third timing signals, and have a common structure of elementary transistors. The first through the third bias circuits 61 have differences in transistor activities of the elementary transistors in the manner which will later become clear.

By way of example, operation will be described as regards the first bias circuit 61(1) which comprises an elementary inverter 65 besides the elementary transistors. While the primary through the 32-ary memory transistors of the first through the (2M–1)-th memory blocks of the first through the N-th memory banks are off, no cell current flows through the read line SC. Meanwhile, the first bias circuit 61(1) keeps an electric potential of the first input point C1 at about 1 V which is a threshold value of the elementary inverter 65. While some of the memory transistors are put on to make the cell current I flow through the read line SC and ascend an output voltage of the elementary inverter 65, the first bias circuit 61(1) decrements the electric potential of the first input point C1.

The first through the third inverters 63 are connected to first through third latch circuits 67(1), 67(2), and 67(3) or 67 controlled by the first through the third timing signals. Through the first through the third inverters 63, first through third differential amplifier output signals are delivered from the first through the third output points D1 to D3 to the first through the third latch circuits 67 and latched in response to build up of the first through the third timing signals. From the first through the third latch circuits 67, first through third latched signals are delivered to a Y elementary decoder 69 and decoded into the first and the second device output signals D(o1) and D(o2).

Referring afresh to FIG. 9 and again to FIGS. 5 through 8, the first timing signal, the X timing signal, and the second and the third timing signals are given the high levels and the low levels during a primary phase of phase 1 after the start, following the primary phase, and during a secondary phase of phase 2 and a ternary phase of phase 3 while the X timing signal has the low level in the manner exemplified along a first or top row through a fourth row indicated by legends φ (1), φ (X), φ (2), and φ (3). As exemplified along a fifth or bottom row indicated by a legend X(c), the X control signal rises after the start St to the reduced voltage V(down) and further rises to the power source voltage Vcc while the X timing signal turns to the low level.

When the X and the Y address signals are supplied to the X decoder 25 and the Y decoder/switch 47, pertinent or relevant ones of the word and the digit lines X and Y are driven to the reduced voltage V(down) of 2.25 V. The selected transistors are decided to deliver their data to the read line SC at the time of start St. At this instant, the high level is given to all the X and the first through the third timing signals. The first through the third differential amplifiers 59 and the first through the third bias circuits 61 are all inactivated. The selected transistors are turned on and off if preliminarily given either the zeroth or the first threshold level and if preliminarily given either the second or the third threshold level.

In the meantime, the timing signal generator 49 puts the timing signals in the phase 1 to give the low level to the first timing signal. This activates the first differential amplifier and bias circuit 59(1) and 61(1).

When either the zeroth or the first threshold level is given to the selected transistors, the cell current I flows into the selected transistors through the read line SC and in the first bias circuit 61(1) through first and second pMOS transistors 71 and 73 and an nMOS transistor 75. The first input point C1 is given an electric potential which is decided by a ratio between current supply capabilities of these elementary transistors and of the selected transistors.

It should be noted in connection with the first bias circuit 61(1) that the second pMOS transistor 73 is given a sufficiently less current supply capability than the selected transistors. As a consequence, a very small current flows through the second pMOS transistor 73. When either the second or the third threshold level is given to the selected transistors, the cell current does not flow through the second pMOS transistor 73.

Figure 9:
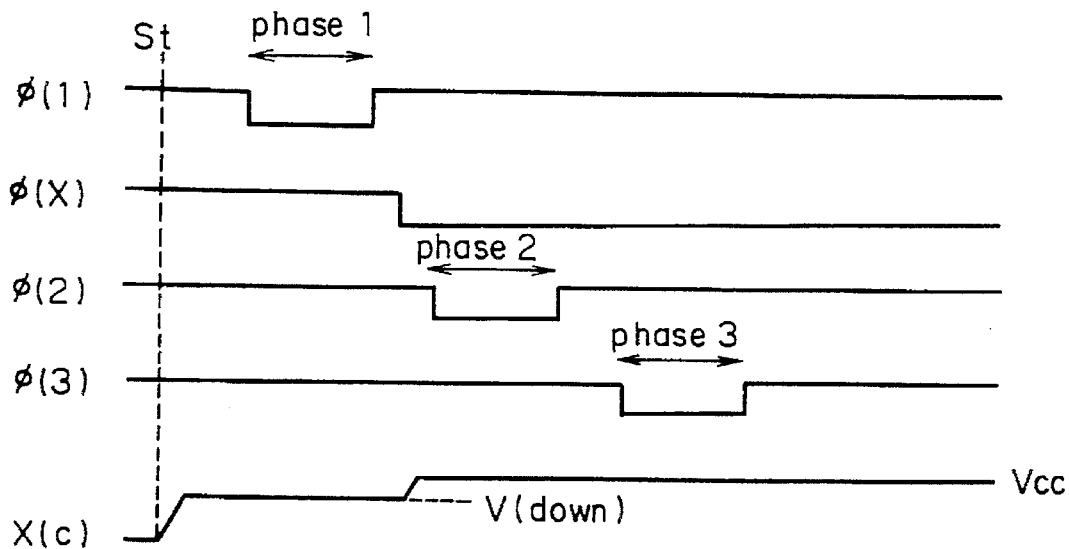
FIG. 9 is a schematic diagram illustrative of cell currents sensed by the sensor unit depicted in FIG. 8.
Figure 10:
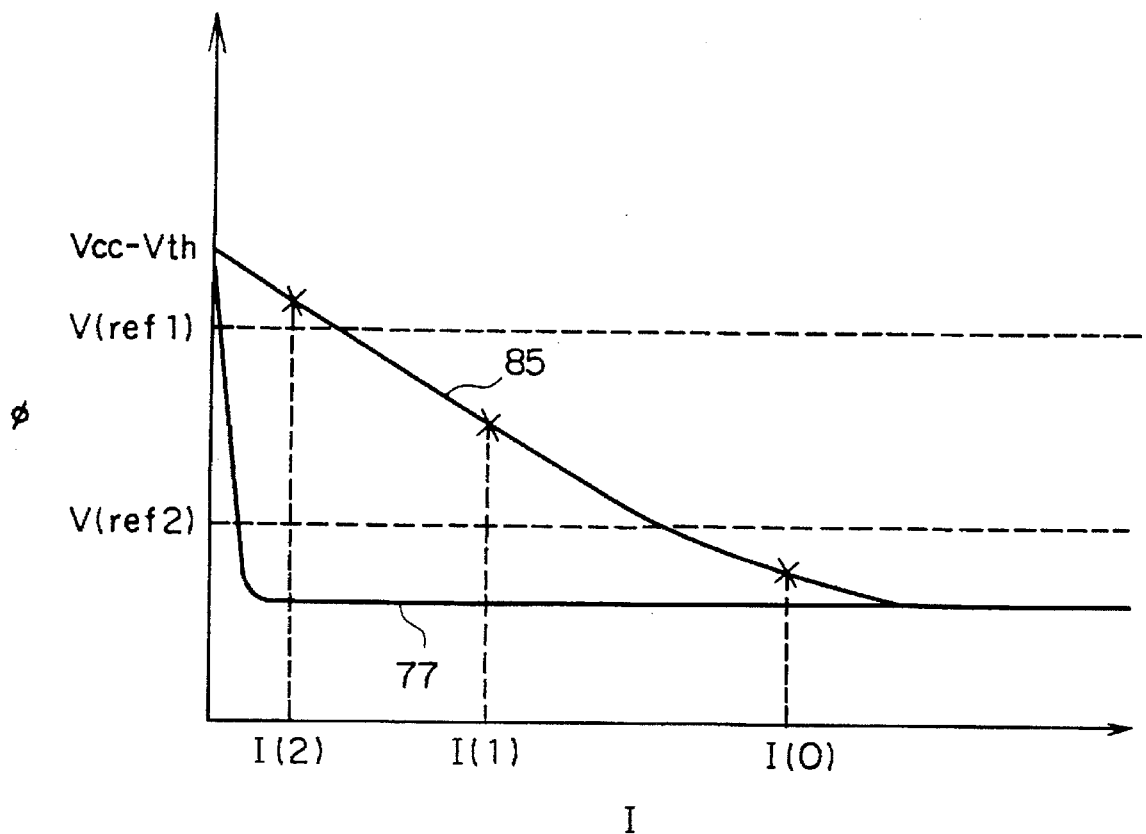
FIG. 10 schematically shows timings of operation of the ROM illustrated in FIG. 5.

Referring to FIG. 10 with FIGS. 8 and 9 continuously referred to, the electric potential is depicted at the first, the second, or the third input point C1, C2, or C3 versus the cell current I and is indicated along the ordinate by φ. The very small current of the second pMOS transistor 73 rapidly reduces the electric potential at the first input point C1 in the manner exemplified by a lower curve 77 below the first reference voltage V(ref1) supplied to the first differential amplifier 69(1) and indicated by an upper horizontal dashed line. This reduction further proceeds below the second reference voltage V(ref2) supplied to the second differential amplifier 59(2) and indicated by a lower horizontal dashed line. Incidentally, the first reference voltage is supplied also to the third differential amplifier 59(3). In contrast, no current of the second pMOS transistor 73 keeps the electric potential at the first input point C1 at a normal height which is higher than the first reference voltage and is equal to the power source voltage Vcc less a threshold voltage Vth of the first pMOS transistor 71.

Figures 11, 12:
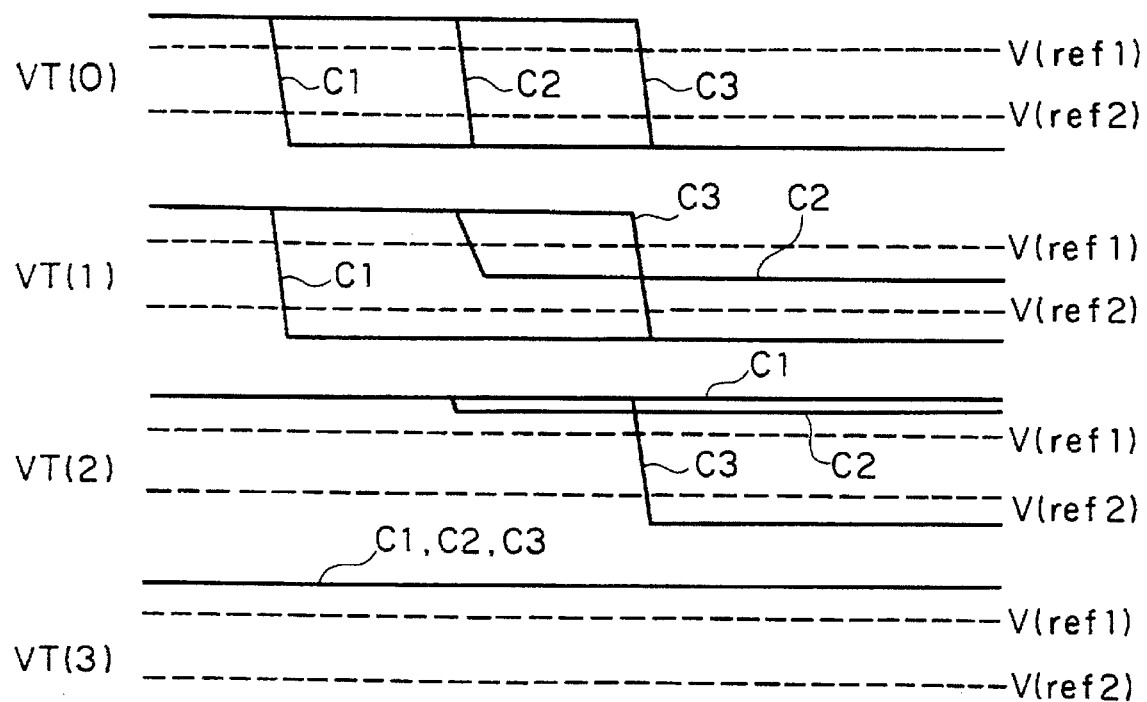
FIG. 11 is a schematic diagram showing characteristics of operation of the sensor unit depicted in FIG. 8.
FIG. 12 shows output data of the sensor unit illustrated in FIG. 8.

Turning to FIG. 11 with FIGS. 8 through 10 continuously referred to, the electric potential at the first input point C1 is depicted with the first and the second reference voltages V(ref1) and V(ref2) indicated again by upper and lower horizontal dashed lines by a stepped graph with a label C1 along a first or top row specified by a legend VT(0). This stepped graph shows the electric potential in question when the zeroth threshold level of 0.5 V is given to the selected transistor. Similarly, the electric potential at the first input point C1 is depicted by a stepped graph with a label C1 along a second row with a legend VT(1) when the first threshold level of 2.0 V is given to the selected transistors. Along a third row with a legend VT(2), the electric potential at the first input point C1 varies as shown by a stepped graph with a label C1 when the second threshold level of 2.5 V is given to the selected transistors. As represented by a third horizontal line with a label C1 along a fourth or bottom row with a legend VT(3), the electric potential at the first input point C1 is kept at the normal height when the third threshold value of 4.0 V is given to the selected transistors.

In FIG. 8, the first differential amplifier 59(1) raises a level at the first output point D1 to a high amplifier level when the electric potential at the first input point C1 goes below the first reference voltage. This high amplifier level is latched by the first latch circuit 67(1) through the first inverter 63(1) as a low latched level. In contrast, the first differential amplifier 69(1) varies the level at the first output point D1 to a low amplifier level when the electric potential at the first input point C1 is higher than the first reference level. The low amplifier level is inverted by the first inverter 63(1) and is latched by the first latch circuit 67(1) as a high latched level upon build up of the first timing signal.

In FIGS. 5 through 11, the X timing signal goes down from the high level in due course to the low level. The voltage descender 57 raises the X control signal to the power source voltage of 3.0 V. The pertinent ones of the first primary to 32-ary through the N-th primary to 32-ary X signals are driven to the power source voltage. If given one of the zeroth through the second threshold values, the selected transistors are rendered on. Only if given the third threshold level, the selected transistors are left off.

Subsequently the second timing signal φ (2) is given the low level during a certain interval of time. This activates the second differential amplifier 69(2) and the second bias circuit 71(2) (the phase 2). The cell current flows through the selected transistors given either the zeroth or the first threshold level.

In the second bias circuit 61(2), the cell current flows into the read line SC through first and second pMOS transistors 79 and 81 and an nMOS transistor 83. The second input point C2 is given an electric potential which is decided by a ratio between current supply capabilities of the second pMOS transistor 81 and the selected transistors.

Whereas, the second pMOS transistor 81 is given a greater current capability than the second pMOS transistor 73 of the first bias circuit 61(1). As a consequence, an electric potential slowly decreases at the second input point C2 as exemplified by a curve 85 with a label C2 in FIG. 10, where I(0), I(1), and I(2) along the abscissa indicates the cell currents which flow through the selected transistors given the zeroth, the first, and the second threshold levels. When the third threshold level is given to the selected transistors, no cell current flows in the manner described above.

Summarizing this case of the phase 2 in FIG. 11, the electric potential at the second input point C2 decreases in the second differential amplifier 59(2) below the second reference voltage as depicted by a stepped graph of the label C2 only when the zeroth threshold level VT(0) is given to the selected transistors. In the second latch circuit 67(2), a low latched level is latched upon build up of the second timing signal. In other events, a high latched level is latched in the second latch circuit 67(2).

It will be assumed in FIGS. 5 through 11 that the third timing signal φ (3) is given the low level during a predetermined interval of time. This activates the third differential amplifier 59(3) and the third bias circuit 61(3) (phase 3). The third bias circuit 61(3) has a characteristic common to the first bias circuit 61(1) which is activated in the phase 1. It therefore follows in the third bias circuit 61(3) that an electric potential is rapidly reduced at the third input terminal C3 by only a light cell current that flows through the read line SC.

In the manner described above, the selected transistors are on and off when given one of the zeroth through the second threshold level and the third threshold level and when the pertinent one of the X signals are driven to the power source voltage. The electric potential therefore is lower in the third differential amplifier 69(3) at the third input point C3 than the first reference voltage unless the third threshold level is given to the selected level. This fact is depicted in FIG. 10 by the curve 77 with a label C3 and in FIG. 11 by stepped graphs and the thick horizontal line with a label C3 along the first through the fourth rows. In the third latch circuit 67(3), a low and a high latched level are latched when one of the zeroth through the second threshold levels and the third threshold level are given to the selected transistors.

Referring to FIG. 12 with FIGS. 8 through 12 continuously referred to, a table shows results described in the foregoing. In the table, a leftmost column shows the threshold levels VT(0) through VT(3) given to the selected transistor together with examples of actual voltages enclosed with parentheses. In three subsequent columns, the latched levels produced by the first through the third latch circuits 67 are indicated by E1, E2, and E3. The low and the high latched levels are indicated by 0 and 1. Two right-side columns show the two-bit device output signals D(o1) and D(o2).

Reviewing FIGS. 5 through 12, read operation is given the phases 1 through 3 for the multi-stage ROM being illustrated. During the phase 1, on or off of the selected transistors is reused to decide whether either one of the zeroth and the first threshold levels or one of the second and the third threshold levels is given to the selected transistors. In the phase 2, the cell current is compared with first and second constant currents to decide, when first and second voltages of 2.25 V and 3.0 V are used to select the selected transistors, whether or not the zeroth threshold level is given to the selected transistors. In the phase 3, on or off of the selected transistors is again reused to decide whether or not the third threshold level is given to the selected transistors.

In the manner described before, the cell current may widely differ when the predetermined threshold levels are subjected to even a small error. This small error may make it difficult by detection of a difference between the cell currents to correctly with no ambiguity to decide which of the first and the second threshold levels is given to the selected transistors.

Even in such an event, it is possible by the illustrated example to use the lower voltage between the first and the second threshold levels in selecting the selected transistors and to clearly distinguish by the difference between the cell currents between the first and the second threshold levels given to the selected transistors. As for differentiation readily decided by sensing the difference in the cell currents between the zeroth and the first threshold levels given to the selected transistors, the higher voltage between the second and the third threshold levels is used in selecting the selected transistors and in distinguishing also between the second and the third threshold levels given to the selected transistors.

As a consequence, it is possible even in shifts are erroneously introduced during manufacture to the zeroth through the third threshold levels to distinguish between the first and the second threshold levels and between the second and the third threshold levels (the phases 1 and 3) unless the shifts are too much introduced into these threshold levels across the low (2.25 V) or the high (3.0 V) voltage used in selecting the selected transistors. No problem takes place in discrimination in the phase 2 between the zeroth and the first threshold levels which are sufficiently widely different and may be subjected to even appreciable shift. This is because the difference is nevertheless wide between the cell currents.

It should additionally be noted that the illustrated multi-stage ROM is driven for read out only twice (low and high) in contrast to the conventional one illustrated with reference to FIGS. 1 and 2. As a result, the data are rapidly read out in contrast to the conventional multi-stage ROM illustrated with reference to FIGS. 3 and 4, no ambiguity results in the illustrated example from only a slight shift in any one of the predetermined threshold levels.

The threshold levels are detected in the foregoing in the order of time of the phases 1 through 3. Such an order is optimal. For example, the order is possible as the phase 1, the phase 3, and then the phase 2. In the first through the third differential amplifiers 59, it is possible to use a common reference voltage of 1.25 V. This makes the circuitry simple. However, it is necessary to use a somewhat longer time as the phases 1 and 3 because the first and the third differential amplifiers 69(1) and 69(3) are thereby given a little slower rate of detection.

Referring afresh to FIG. 13 and again to FIGS. 5 through 7 and 9, the sensor unit 27 is for use in a multi-stage ROM according to a second embodiment of this invention. Except for the sensor unit 27, other elements are not different from those described above.

The sensor unit 27 is now simplified in structure by using the first differential amplifier 59(1) and the first bias circuit 61(1) in common to the phases 1 and 3 with a slight modification. More particularly, the first pMOS transistor 71 is turned on in the first bias circuit 61(1) in the phases 1 and 3 by the first and the third timing signals $\phi$ (1) and $\phi$ (3) supplied thereto through a bias circuit AND gate 87 with the first differential amplifier 59(1) activated by delivery thereto of the first and the third timing signals through an amplifier AND gate 89. In the phase 2, the first pMOS transistor 79 is switched on as before with the second differential amplifier 59(2) activated. Relationships in the current supply capabilities are not different from the sensor unit 27 described in conjunction with FIG. 8 between either the nMOS transistor 75 in the first bias circuit 61(1) or the nMOS transistor 83 in the second bias circuit 61(2) and the selected transistors. The first and the third latch circuits 67(1) and 67(3) are connected both to the first inverter 63(1) and are separately latched by the first and the third timing signals.

In this manner, the first bias circuit 61(1) and the differential amplifier 59(1) are used in a time division fashion in common in the phases 1 and 3. In this sensor unit 27, the order of the phases 1 through 3 is optional. Moreover, it is possible to use the reference voltage of 1.25 V in common in the phases 1 through 3.

Figure 14:
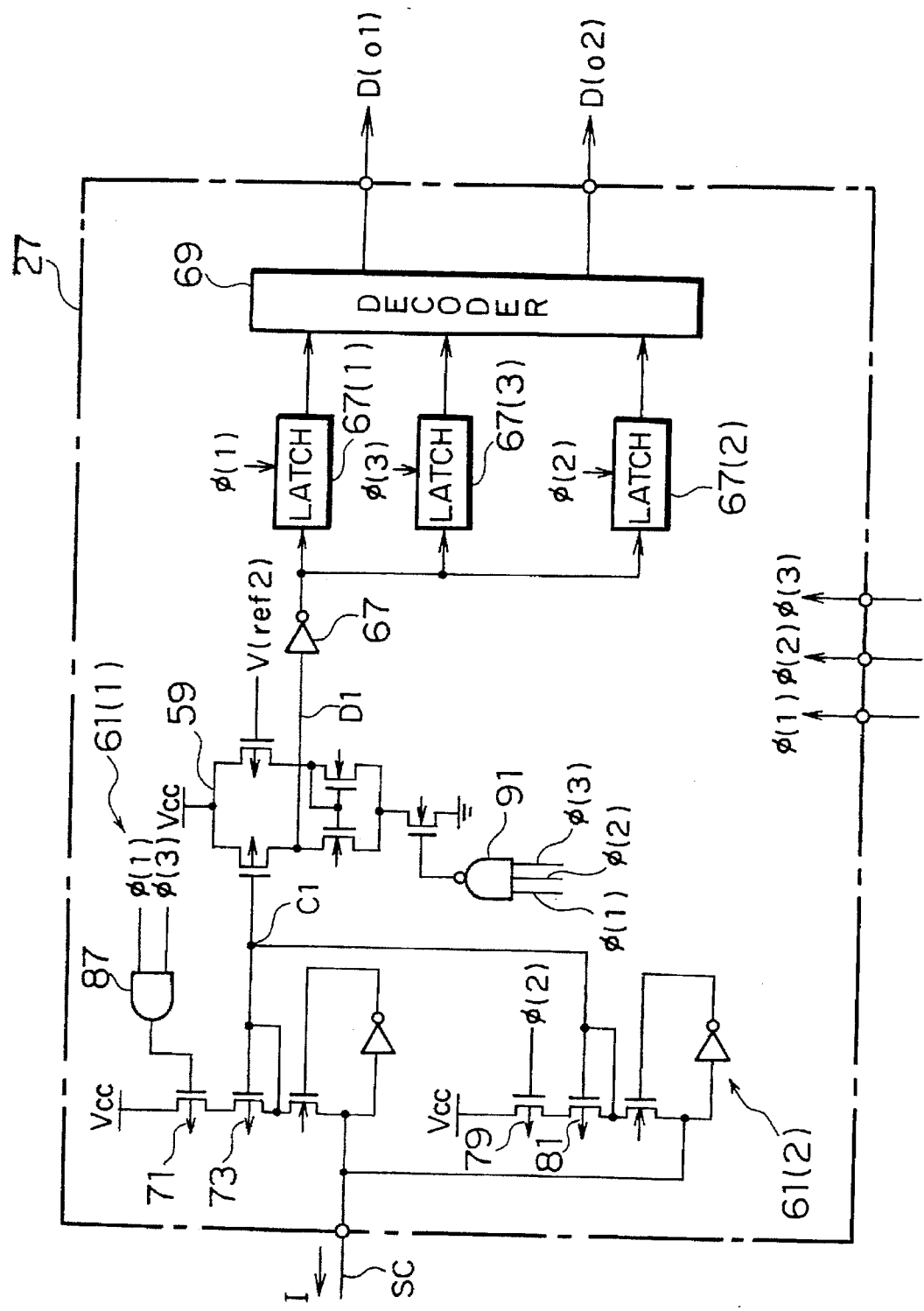
FIG. 14 shows partly in blocks a sensor unit for use in a multi-stage ROM according to a third embodiment of this invention.

Turning to FIG. 14 with FIGS. 5 through 7 and 9 continuously referred to, the sensor unit 27 is further simplified in structure for use in a multi-stage ROM according to a third embodiment of this invention. Other circuit elements are not different from those described with reference to FIGS. 5 through 7.

In the sensor unit 27, only one sole differential amplifier 59 is activated in the phases 1 through 3 by supply thereto of the first through the third timing signals $\phi$ (1), $\phi$ (2), and $\phi$ (3) through a three-input AND gate 91. Supplied with the second reference voltage V(ref2) of 1.25 V, the sole differential amplifier 59 has the input point C1 connected to the second pMOS transistors 73 and 81 of the first and the second bias circuits 61(1) and 61(2). The sole differential amplifier 59 has the output point D1 connected to only one inverter 67 which is in turn connected to the first through the third latch circuits 67 latched by the first through the third timing signals.

The sole differential amplifier 59 compares the electric potential of the input point C1 with the second reference voltage always in the phases 1 through 3. Comparison is nevertheless possible because the electric potential is decided in the phases 1 and 3 by the second pMOS transistor 73 of the first bias circuit 61(1) and in the phase 2 by the second pMOS transistor 81 of the second bias circuit 61(2).

The sensor unit 27 is very simple in structure and operation. The input point C1 is, however, connected to a somewhat heavy load. This makes it necessary to use a more or less longer time until the electric potential becomes steady at the input point C1.

Figure 15:
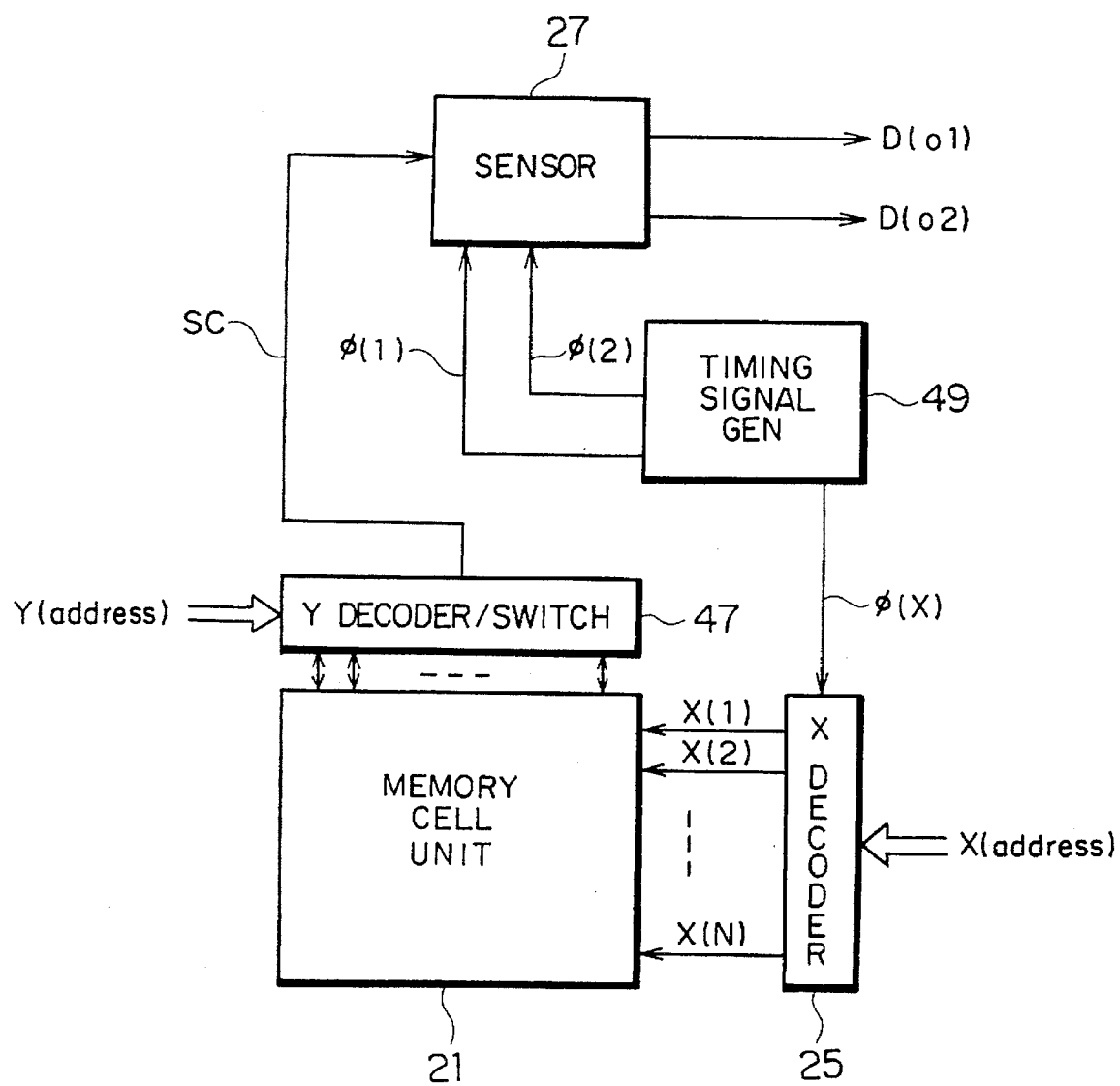
FIG. 15 is a block diagram of a multi-stage ROM according to a fourth embodiment of this invention.

Referring now to FIG. 15 with FIGS. 6, 7, and 9 again referred to, attention will be directed to a multi-stage ROM according to a fourth embodiment of this invention. This ROM is operable only in phases 1 and 2. In the phase 1, the ROM discriminates either between the zeroth and the first threshold levels VT(0) and VT(1) or between the second and the third threshold values VT(2) and VT(3) which are given to the selected transistors. Based on results of this discrimination, the ROM is put in operation in the phase 2. More specifically, the selected transistors are monitored in the phase 2 as regards between the zeroth and the first threshold levels and between the second and the third threshold levels when the results of discrimination in the phase 1 are decision of either of the zeroth and the first threshold levels and decision of either of the second and the third threshold levels, respectively.

The timing signal generator 49 delivers the X timing signal φ (X) to the X decoder 25 as above and only the first and the second timing signals φ (1) and φ (2) to the Y decoder/switch 47. The sensor unit 27 will shortly be described. In other respects, the ROM is not different from that illustrated with reference to FIGS. 5 through 7. The timing signals φ (X), φ (1), and φ (2) are similar to those described in connection with FIG. 9.

Figure 16:
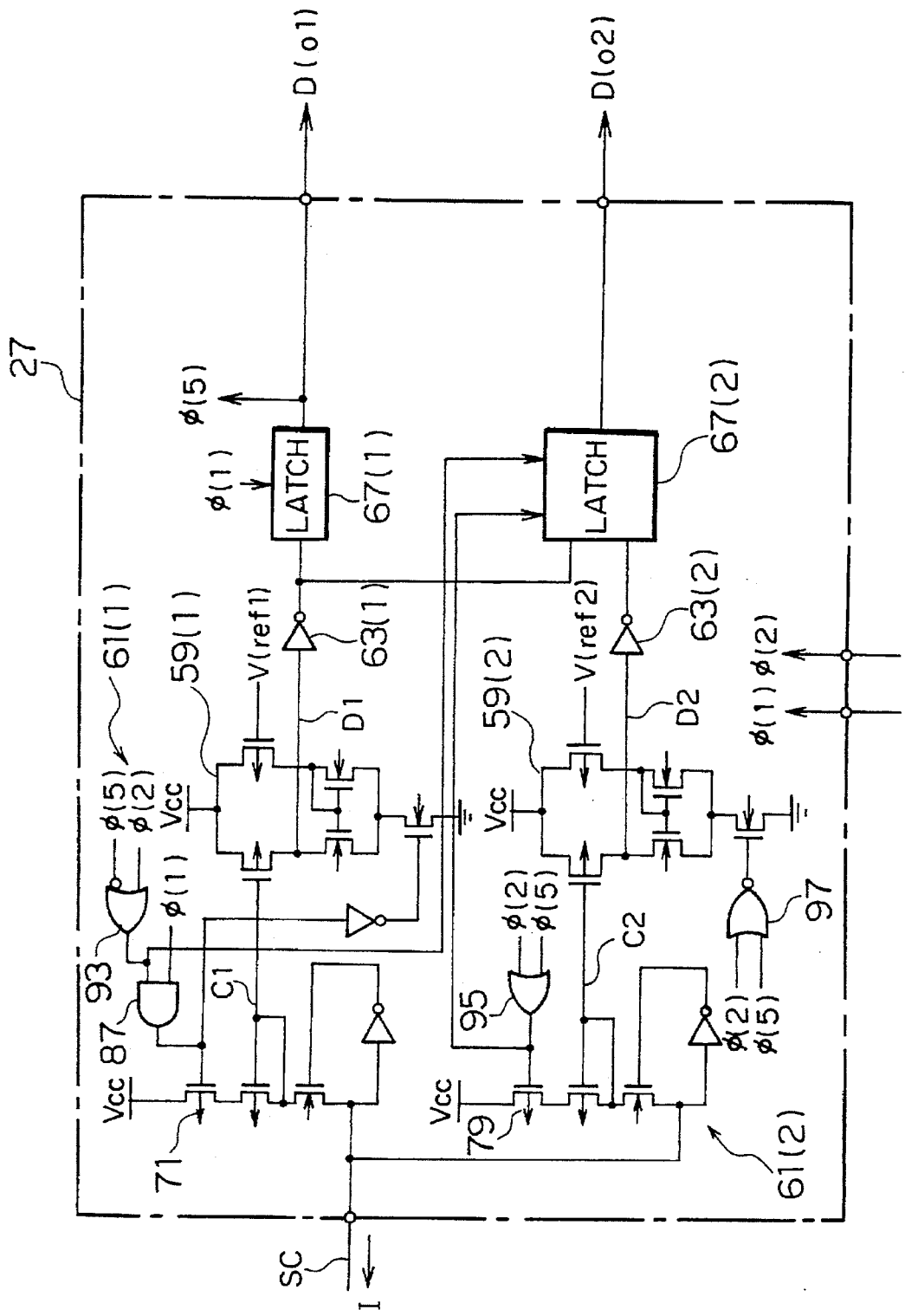
FIG. 16 shows partly in blocks a sensor unit for use in the ROM illustrated in FIG. 15.

Turning to FIG. 16 with FIGS. 5 through 7, 9, and 15 continuously referred to, the sensor unit 27 is similar in general to that described with reference to FIGS. 10 through 13. Modified are, however, the first and the second differential amplifiers 59(1) and 59(2) and the first and the second bias circuits 61(1) and 61(2). The first and the second latch circuits 67(1) and 67(2) only are connected to the first and the second inverters 63. Use is not made of the Y elementary decoder 69 described in connection with FIGS. 8, 13, and 14.

The first and the second differential amplifiers 59 produce first and second amplifier output signals at the first and the second output points D1 and D2. Inverted by the first and the second inverters 63, the first and the second amplifier output signals are latched in the first and the second latch circuits and are produced as the two-bit device output signal D(o1) and D(o2) as will be described in detail in the following. The first latch circuit 67(1) is controlled by the first timing signal like in FIG. 13. Produced by the first latch circuit 67(1), a first bit D(o1) of the two-bit device output signal is used additionally as a timing control signal which will be described by a reference symbol φ (5).

For control of the first differential amplifier 59(1) and the first bias circuit 61(1), a first OR gate 93 is supplied with the second timing signal φ (2) and an inverted signal of the timing control signal φ (5) to produce a first OR output signal. The AND gate 87 is supplied with the first timing signal φ (1) and, instead of the third timing signal, the OR output signal to produce an AND output signal, which is delivered, in place of only the first timing signal described in conjunction with FIG. 8, to the first differential amplifier 59(1) and to the first bias circuit 61(1). Similarly, a second OR gate 95 is supplied with the second timing signal and the timing control signal to deliver a second OR output signal for delivery to the second bias circuit 61(2). Instead of the second timing signal described in conjunction with FIG. 8, the first and the second OR output signals are used to control the second latch circuit 67(2). Rather than an unnumbered inverter used in FIG. 8 or 13, a third OR gate 97 is supplied with the second timing signal and the timing control signal for delivery of an inverted OR output signal to the second differential amplifier 59(2).

The X and the first and the second timing signal has levels variable in the manner described in conjunction with FIG. 9. Immediately after the start St, these timing signals are high. The first pMOS transistors 71 ad 79 of the first and the second bias circuits 61 are therefore off. The first and the second differential amplifiers 59 are deactivated. Inasmuch as the pertinent ones of the word lines X are driven to the reduced voltage of 2.25 V, the selected transistors are on and off if given either the zeroth or the first threshold level and if given either the second or the third threshold level, respectively.

Subsequently, the first timing signal is given the low level during the phase 1. Meanwhile, the first pMOS transistor 71 is rendered on. The first differential amplifier 59(1) is activated. If the selected transistors are on, the low latched level is latched in the first latch circuit 67(1) upon build up of the first timing signal, namely, at the end of the phase 1. If the selected transistors are off, the high latched level is latched at the end of the phase 1 in the first latch circuit 67(1).

In due course, the X timing signal goes low. In response, the pertinent ones of the word lines x are driven to the power source voltage of 3.0 V. The selected transistors are on and off if given one of the zeroth through the second threshold levels and if given the third threshold levels, respectively.

While the latched level is low in the first latch circuit 67(1), the first OR output signal is high irrespective of the level of the second timing signal. The second OR output signal is in phase coincidence with the second timing signal. If output inversion of the third OR gate 97 is taken into account, this NOR output signal is phase opposite relative to the second timing signal.

When the second timing signal is given meanwhile the low level to define the phase 2, the first pMOS transistor 79 is rendered on. The second differential amplifier 59(2) is activated. On the other hand, the first pMOS transistor 71 is switched off in the first bias circuit 61(1) by a high output level of the AND gate 87. The first differential amplifier 59(1) is deactivated. Upon build up of the second timing signal, namely, at the end of the phase 2, the latched level becomes low and high in the second latch circuit 67(2) when the zeroth threshold level and the first threshold level are given to the selected transistors, respectively.

While the latched level is high in the first latch circuit 67(1), the first OR output signal is phase reversed relative to the second timing signal. The second OR and the NOR output signals are high and low irrespective of the level of the second timing signal.

When the second timing signal is given meanwhile the low level to specify the phase 2, the first pMOS transistor 71 is rendered on. The first differential amplifier 59(1) is activated. On the other hand, the first pMOS transistor 79 is switched off by the high level of the second OR output signal. The second differential amplifier 59(2) is deactivated by the low level of the NOR output signal. At the end of the phase 2, the latched level becomes low and high in the first latch circuit 67(1) when the third threshold level and the fourth threshold level are given to the selected transistors, respectively.

Reviewing FIGS. 15 and 16, the cell current is sensed in the phase 1 to judge whether one of the zeroth and the first threshold levels or one of the third and the fourth threshold levels is given to the selected transistors. Based on such results of discrimination obtained in the phase 1 and with the X timing signal given the low level, the cell current is additionally judged in the phase 2 which of the zeroth and the first threshold levels or which of the third and the fourth levels is given to the selected transistors. In the manner exemplified in FIG. 9, it is possible to make the low level of the first timing signal be immediately followed by a lowered level of the X timing signal and to make this lowering be immediately followed by the low level of the second timing signal. This makes it possible to very quickly read the data.

Figure 17:
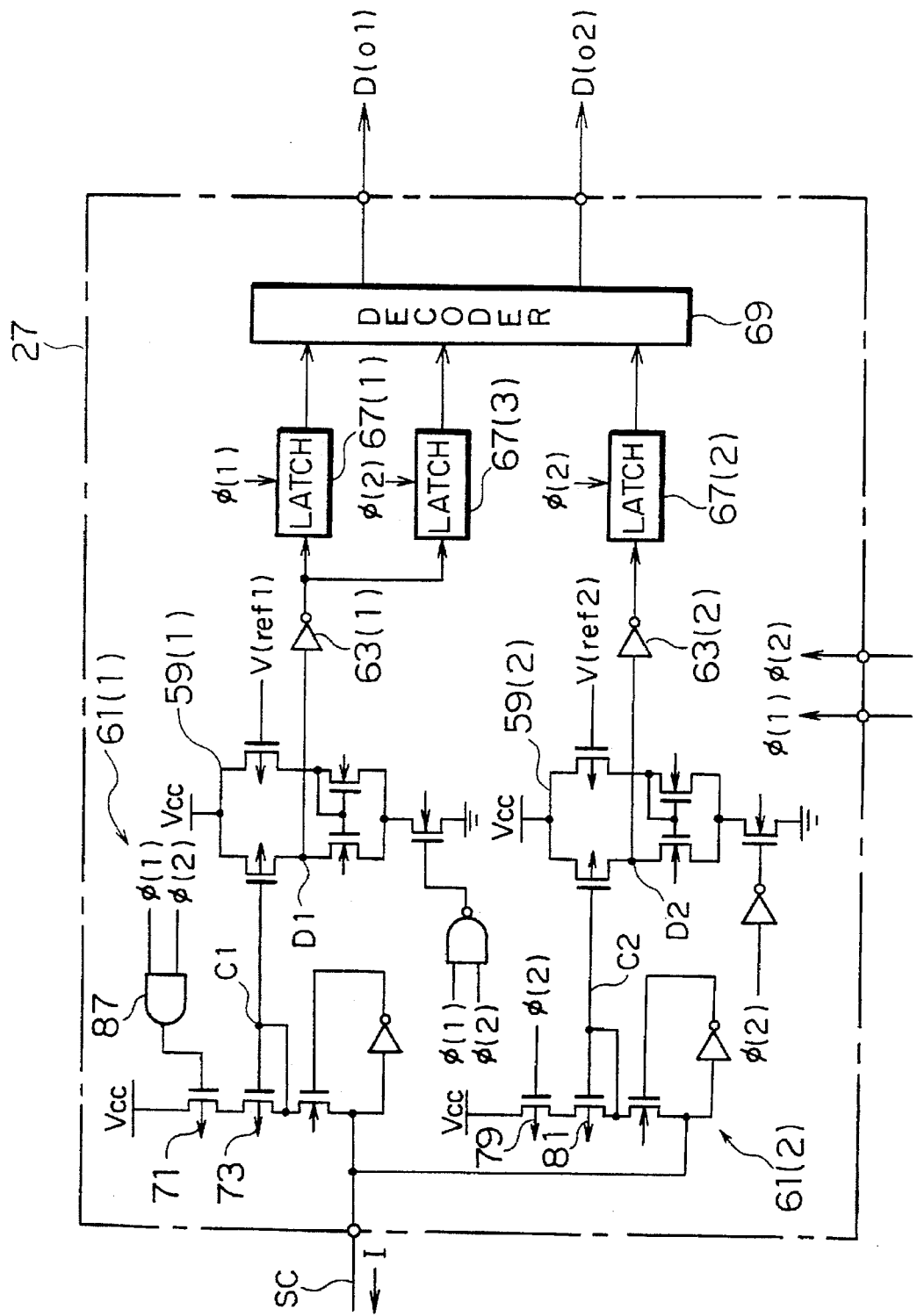
FIG. 17 shows partly in blocks a sensor unit for use in a multi-stage ROM according to a fifth embodiment of this invention.

Further turning to FIG. 17 with FIGS. 6, 7, 9, and 15 again referred to, the sensor unit 27 is for use in a multi-stage ROM according to a fifth embodiment of this invention. Except for this sensor unit 27, the ROM is not different from that illustrated with reference to FIG. 15.

Figure 13:
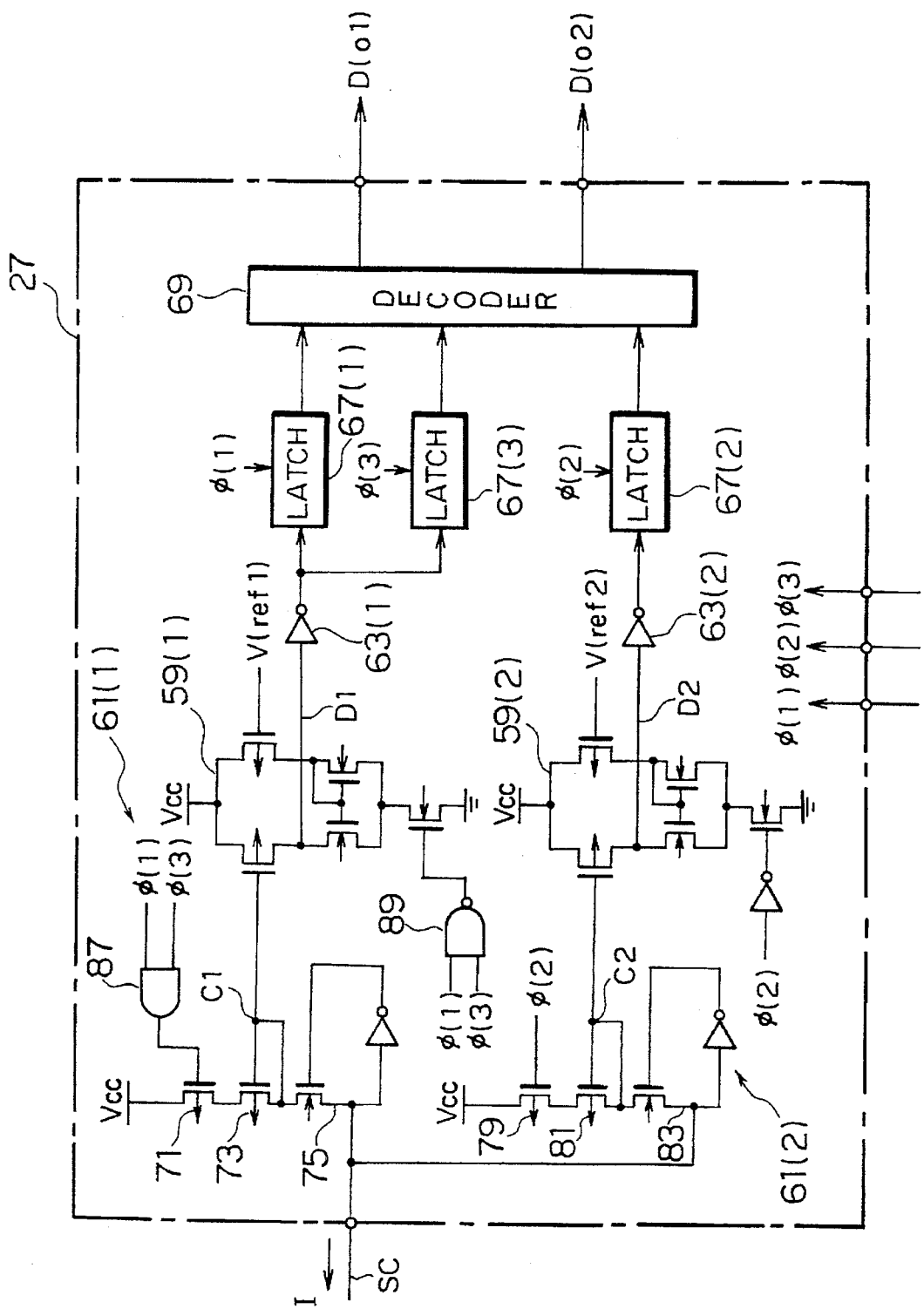
FIG. 13 shows partly in blocks a sensor unit for use in a multi-stage ROM according to a second embodiment of this invention.

The sensor unit 27 is very similar in structure to that described in conjunction with FIG. 13. Although the X timing signal ϕ (X) is used in the X decoder 25 as throughout the foregoing to consequently vary the cell current I in accordance with four threshold levels given to the selected transistors, only the first and the second timing signals ϕ (1) and ϕ (2) are used in the sensor unit 27. Role of the third timing signal ϕ (3) is played by the second timing signal.

As a result of this modification of the sensor unit 27, the ROM is operable in the example being illustrated only in accordance with the phases 1 and 2 like the ROM illustrated with reference to FIGS. 15 and 16. The illustrated example is, however, different from the ROM of FIGS. 15 and 16. This difference is such that operation in the phase 2 is not based on the result of judgement in the phase 1 but that operation in the phase 1 is followed by concurrently carrying out operations carried out in the phases 2 and 3 by the ROM illustrated with reference to FIGS. 5 through 12.

More particularly, the second timing signal ϕ (2) is supplied, instead of the third timing signal, to the first differential amplifier 59(1) at the amplifier AND gate 89, to the first bias circuit 61(1) at the bias circuit AND gate 87, and to the second latch circuit 67(3). When the low level is given in the phase 2 to the second timing signal, the first and the second differential amplifiers 59 and both activated. In the first and the second bias circuits 61, the first pMOS transistors 71 and 79 are both switched on. As a consequence, the first difference amplifier 59(1) judges whether the selected transistors are on or off. At the same time, the second differential amplifier 59(2) measures the cell current I following through the selected transistors. This makes it possible for the illustrated ROM, like that described in conjunction with FIGS. 15 and 16, to discriminate between the four threshold levels given to the selected transistors and to quickly read the data.

It should be noted in connection with the above that the cell current flows in the phase 2 through both the second pMOS transistors 73 and 81 in the first and the second bias circuits 71 and that the former transistor 73 is made to have a less current supply capability than the latter transistor 81 like in the sensor unit 27 described in connection with FIG. 8. As a consequence, most of the cell current flows during the phase 2 into the second differential amplifier 59(2) through the latter transistor 81 when one of the zeroth through the second threshold levels is given to the selected transistors. As for the first differential amplifier 59(1), the electric potential is lowered very slight during the phase 2 at the input point C1 even though the cell current may be caused to flow through the selected transistors. It is nevertheless possible to detect this slight lowering in the electric potential and to monitor on or off of the selected transistors. This is rendered possible by making the first reference voltage V(ref1) a little approach the normal height ϕ (FIG. 10), namely, the source power voltage Vcc less the threshold voltage Vth of the first pMOS transistor 71 of the first bias circuit 61(1), for supply to the first differential amplifier 59(1). Alternatively, the current supply capability of the second pMOS transistor 81 of the second bias circuit 61(2) is a little reduced with the second reference voltage accordingly raised for supply to the second differential amplifier 59(2).

While the multi-stage ROM of this invention has been described above with reference to FIGS. 5 through 17, it is now readily possible to use such an ROM to read a datum of more than four kinds. For example, it is possible to read a datum of eight bits by concurrently accessing four times as many the memory transistors as the selected transistors described in the foregoing. Depending on the circumstances, it is possible to use one alone of two bits of the device output signal. It is moreover possible to use more threshold levels, greater than four in number, for storage of a datum in each transistor memory cell.

In the manner thus far described, it is possible with this invention to provide a method of exactly and quickly reading data from a multi-stage ROM in which data are stored as a plurality of threshold levels given to memory transistors even when the data are read with a low operating voltage and without a complicated X decoder. This is possible because the zeroth through the third threshold level are predetermined such that only on or off of the selected transistors is usable on threshold discrimination between the first and the second threshold levels in a range where a serious influence is caused on a cell current flowing through the selected transistors by shifts in the threshold values and such that the cell currents are detected under a condition in threshold discrimination between the zeroth and the first threshold values in another range where a weak influence is caused on the cell current by the shifts, which condition is used with no change in discrimination between on and off of the selected transistor in still another range comprising the second and the third threshold values.

What is claimed is:

1. A method of reading data from a multi-stage semiconductor memory device comprising a plurality of transistor memory cells, each given a selected threshold level selected from a zeroth threshold level, a first threshold level higher than said zeroth threshold level, a second threshold level higher than said first threshold level, and a third threshold level higher than said second threshold level, said method comprising the steps of:

selecting a selected memory cell from said transistor memory cells;

judging on or off of said selected memory cell when said selected memory cell is supplied with a first voltage between said zeroth and said first threshold levels; and judging from a cell current flowing said selected memory cell during supply to said selected memory cell with a second voltage between said second and said third threshold levels whether or not said selected threshold level is said zeroth threshold level.

2. A method as claimed in claim 1, further comprising the step of judging on or off of said selected memory cell when said selected memory cell is supplied with said second voltage.

3. A multi-stage semicondutor memory device comprising:

a plurality of transistor memory cells, each given a selected threshold level selected from a zeroth threshold level, a first threshold level higher than said zeroth threshold level, a second threshold level higher than said first threshold level, and a third threshold level higher than said second threshold level;

selecting means responsive to address signals for selecting a selected memory cell from said transistor memory cells;

supply means responsive to a control signal variable between first and second logic levels for supplying said selecting means with a first voltage between said zeroth and said first threshold levels and a second voltage between said second and said third threshold levels while said control signal has said first and said second logic levels, respectively;

first judging means for judging on or off of said selected memory cell while said control signal has said first logic level; and second judging means for judging, by comparison between a predetermined constant current and a cell current flowing through said selected memory cell while said control signal has said second logic level, whether or not said selected threshold level is said zeroth threshold level.

4. A multi-stage semiconductor memory device as claimed in claim 3, wherein said second judging means comprises:

primary judging means for judging on or off of said selected memory cell while said control signal has said second logic level; and secondary judging means for judging, by comparison if said selected memory cell is on, whether or not said selected threshold level is said zeroth threshold level.

5. A multi-stage semiconductor memory device comprising first through N-th word lines and first through M-th digit lines crossing said first through said N-th word lines at cross points, where N and M represent first and second predetermined integers, a plurality of semiconductor memory cells at said cross points, selecting means responsive to address signals for selecting a selected word line from said first through said N-th word lines and a selected digit line from said first through said M-th digit lines, driving means for driving said selected word line to one of first and second voltages, and sensing means for sensing a cell current flowing through said selected digit line, wherein said sensing means compares said cell current with first and second constant currents while said selected word line is driven to said first and said second voltages, respectively.

6. A multi-stage semiconductor memory device as claimed in claim 5, each of said semiconductor memory cells being given a selected one of zeroth, first, second, and third threshold levels, wherein:

said first voltage is between said zeroth and said first threshold levels;

said second voltage being between said second and said third threshold levels.

7. A multi-stage semiconductor memory device as claimed in claim 6, said zeroth threshold level being lower than said first threshold level, said first threshold level being lower than said second threshold level, said second threshold level being lower than said third threshold level, wherein said first constant current is less than said second constant current.

8. A multi-stage semiconductor memory device as claimed in claim 5, wherein said sensing means compares, while said selected word line is driven to said second voltage, said cell current with said first constant current besides said second constant current.

9. A multi-stage semiconductor memory device as claimed in claim 8, each of said semiconductor memory cells being given a selected one of zeroth, first, second, and third threshold levels, wherein:

said first voltage is between said zeroth and said first threshold levels;

said second voltage being between said second and said third threshold levels.

10. A multi-stage semiconductor memory device as claimed in claim 9, said zeroth threshold level being lower than said first threshold level, said first threshold level being lower than said second threshold level, said second threshold level being lower than said third threshold level, wherein said first constant current is less than said second constant current.

11. A multi-stage semiconductor memory device as claimed in claim 5, wherein:

said sensing means produces a comparison result indicative of a result of comparison of said cell current with said first constant current while said selected word line is driven to said first voltage;

said sensing means comparing said cell current, while said selected word line is driven to said second voltage, with one of said first and said second constant currents that is selected based on said comparison result.

12. A multi-stage semiconductor memory device as claimed in claim 11, each of said semiconductor memory cells being given a selected one of zeroth, first, second, and third threshold levels, wherein:

said first voltage is between said zeroth and said first threshold levels;

said second voltage being between said second and said third threshold levels.

13. A multi-stage semiconductor memory device as claimed in claim 12, said zeroth threshold level being lower than said first threshold level, said first threshold level being lower than said second threshold level, said second threshold level being lower than said third threshold level, wherein said first constant current is less than said second constant current.

* * * * *